(12) United States Patent
Cui et al.

(10) Patent No.: US 12,058,916 B1
(45) Date of Patent: Aug. 6, 2024

(54) DEVICES WITH DISPLAYS HAVING TRANSPARENT OPENINGS AND A DIFFRACTIVE LAYER

(71) Applicant: Apple Inc., Cupertino, CA (US)

(72) Inventors: Yue Cui, Campbell, CA (US); Yi Qiao, San Jose, CA (US); Jean-Pierre S. Guillou, Los Gatos, CA (US); Ming Xu, Cupertino, CA (US); Shawn R. Gettemy, San Martin, CA (US)

(73) Assignee: Apple Inc., Cupertino, CA (US)

( * ) Notice: Subject to any disclaimer, the term of this patent is extended or adjusted under 35 U.S.C. 154(b) by 255 days.

(21) Appl. No.: 17/208,973

(22) Filed: Mar. 22, 2021

Related U.S. Application Data

(60) Provisional application No. 63/031,422, filed on May 28, 2020.

(51) Int. Cl.
*G02B 27/42* (2006.01)
*G02B 5/30* (2006.01)
*H10K 59/12* (2023.01)
*H10K 59/65* (2023.01)
*H10K 59/40* (2023.01)

(52) U.S. Cl.
CPC ........... *H10K 59/65* (2023.02); *G02B 5/3025* (2013.01); *G02B 27/4205* (2013.01); *H10K 59/12* (2023.02); *H10K 59/40* (2023.02)

(58) Field of Classification Search
CPC .. G02B 5/3025; G02B 27/00; G02B 27/4205; G02B 5/0294
See application file for complete search history.

(56) References Cited

U.S. PATENT DOCUMENTS

| | | | |
|---|---|---|---|
| 7,940,457 B2 | 5/2011 | Jain et al. | |
| 8,724,942 B2 | 5/2014 | Logunov et al. | |
| 2012/0300307 A1* | 11/2012 | Borrelli | G02F 1/133502 |
| | | | 359/609 |
| 2015/0241705 A1 | 8/2015 | Abovitz et al. | |
| 2019/0041658 A1 | 2/2019 | Gollier et al. | |
| 2019/0094541 A1 | 3/2019 | Choi et al. | |
| 2020/0212362 A1* | 7/2020 | Leng | H10K 59/12 |
| 2021/0278583 A1* | 9/2021 | Chen | G02B 1/14 |
| 2021/0286113 A1* | 9/2021 | Yang | G02B 5/1852 |
| 2022/0278186 A1* | 9/2022 | Choi | H10K 59/121 |

FOREIGN PATENT DOCUMENTS

WO 2019202554 A1 10/2019

\* cited by examiner

*Primary Examiner* — Eric K Ashbahian
(74) *Attorney, Agent, or Firm* — Treyz Law Group, P.C.; Joseph F. Guihan; Jinie M. Guihan

(57) ABSTRACT

An electronic device may include a display and an optical sensor formed underneath the display. The electronic device may include a plurality of transparent windows that overlap the sensor. The resolution of the display panel may be reduced in some areas due to the presence of the transparent windows. To increase the apparent resolution of the display in portions of the display panel with the transparent windows, the display may include a light spreading layer that includes a plurality of diffractive elements. The light spreading layer may spread visible light from the array of pixels such that the display resolution at the outer surface of the display is greater than at the display panel. The light spreading layer may selectively spread visible light but not infrared light. The display may also include a lens layer that focuses light onto the transparent windows.

19 Claims, 14 Drawing Sheets

DEVICES WITH DISPLAYS HAVING TRANSPARENT OPENINGS AND A DIFFRACTIVE LAYER

This application claims the benefit of provisional patent application No. 63/031,422, filed May 28, 2020, which is hereby incorporated by reference herein in its entirety.

BACKGROUND

This relates generally to electronic devices, and, more particularly, to electronic devices with displays.

Electronic devices often include displays. For example, an electronic device may have an organic light-emitting diode (OLED) display based on organic light-emitting diode pixels. In this type of display, each pixel includes a light-emitting diode and thin-film transistors for controlling application of a signal to the light-emitting diode to produce light. The light-emitting diodes may include OLED layers positioned between an anode and a cathode.

There is a trend towards borderless electronic devices with a full-face display. These devices, however, may still need to include sensors such as cameras, ambient light sensors, and proximity sensors to provide other device capabilities. Since the display now covers the entire front face of the electronic device, the sensors will have to be placed under the display stack. In practice, however, the amount of light transmission through the display stack is very low (i.e., the transmission might be less than 20% in the visible spectrum), which severely limits the sensing performance under the display.

It is within this context that the embodiments herein arise.

SUMMARY

An electronic device may include a display and an optical sensor formed underneath the display. The electronic device may include a plurality of non-pixel regions that overlap the optical sensor. Each non-pixel region may be devoid of thin-film transistors and other display components. The plurality of non-pixel regions is configured to increase the transmittance of light through the display to the sensor. The non-pixel regions may therefore be referred to as transparent windows in the display.

The resolution of the display panel may be reduced in some areas due to the presence of the transparent windows. To increase the apparent resolution of the display at the outer surface of the display, the display may include a light spreading layer that includes a plurality of diffractive elements. The light spreading layer may spread visible light from the array of pixels such that the display resolution at the outer surface of the display is greater than at the display panel. In this way, the display may have a uniform resolution at the outer surface despite the absence of some pixels in the transparent window areas.

The light spreading layer may be formed from first and second layers that have a refractive index difference at visible wavelengths. The first and second layers may have little to no refractive index difference at infrared wavelengths to avoid disrupting infrared light that is sensed by a sensor underneath the display.

The display may also include a lens layer that focuses light onto the transparent windows. The lens layer may be formed from first and second layers that have a refractive index difference at infrared wavelengths. The first and second layers may have little to no refractive index difference at visible wavelengths to avoid disrupting visible light that is emitted by the display.

BRIEF DESCRIPTION OF THE DRAWINGS

FIG. 14 is a cross-sectional side view of an illustrative display stack with both a diffractive layer for increasing the apparent resolution of the display and a lens layer for

DETAILED DESCRIPTION

Figure 1:
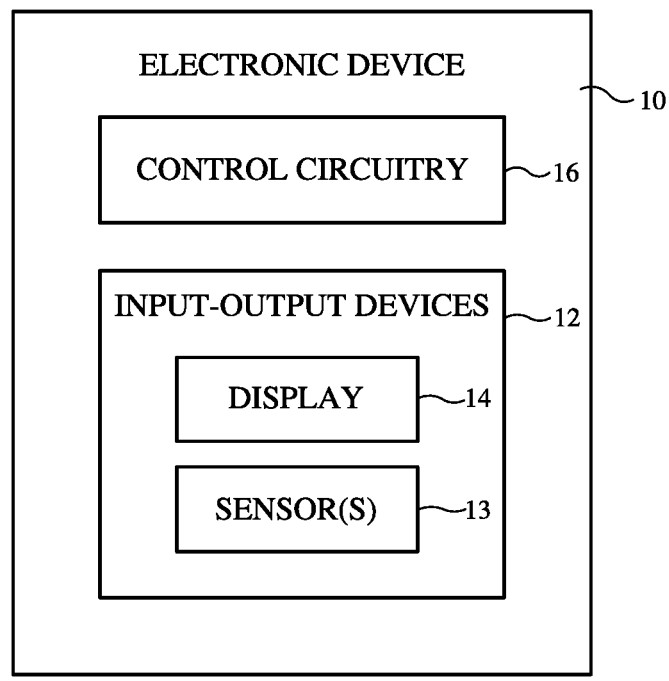
FIG. 1 is a schematic diagram of an illustrative electronic device having a display and one or more sensors in accordance with an embodiment.

An illustrative electronic device of the type that may be provided with a display is shown in FIG. 1. Electronic device 10 may be a computing device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a display, a computer display that contains an embedded computer, a computer display that does not contain an embedded computer, a gaming device, a navigation device, an embedded system such as a system in which electronic equipment with a display is mounted in a kiosk or automobile, or other electronic equipment. Electronic device 10 may have the shape of a pair of eyeglasses (e.g., supporting frames), may form a housing having a helmet shape, or may have other configurations to help in mounting and securing the components of one or more displays on the head or near the eye of a user.

As shown in FIG. 1, electronic device 10 may include control circuitry 16 for supporting the operation of device 10. Control circuitry 16 may include storage such as hard disk drive storage, nonvolatile memory (e.g., flash memory or other electrically-programmable-read-only memory configured to form a solid-state drive), volatile memory (e.g., static or dynamic random-access memory), etc. Processing circuitry in control circuitry 16 may be used to control the operation of device 10. The processing circuitry may be based on one or more microprocessors, microcontrollers, digital signal processors, baseband processors, power management units, audio chips, application-specific integrated circuits, etc.

Input-output circuitry in device 10 such as input-output devices 12 may be used to allow data to be supplied to device 10 and to allow data to be provided from device 10 to external devices. Input-output devices 12 may include buttons, joysticks, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input resources of input-output devices 12 and may receive status information and other output from device 10 using the output resources of input-output devices 12.

Input-output devices 12 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements. A touch sensor for display 14 may be formed from electrodes formed on a common display substrate with the display pixels of display 14 or may be formed from a separate touch sensor panel that overlaps the pixels of display 14. If desired, display 14 may be insensitive to touch (i.e., the touch sensor may be omitted). Display 14 in electronic device 10 may be a head-up display that can be viewed without requiring users to look away from a typical viewpoint or may be a head-mounted display that is incorporated into a device that is worn on a user's head. If desired, display 14 may also be a holographic display used to display holograms.

Control circuitry 16 may be used to run software on device 10 such as operating system code and applications. During operation of device 10, the software running on control circuitry 16 may display images on display 14.

Input-output devices 12 may also include one or more sensors 13 such as force sensors (e.g., strain gauges, capacitive force sensors, resistive force sensors, etc.), audio sensors such as microphones, touch and/or proximity sensors such as capacitive sensors (e.g., a two-dimensional capacitive touch sensor associated with a display and/or a touch sensor that forms a button, trackpad, or other input device not associated with a display), and other sensors. In accordance with some embodiments, sensors 13 may include optical sensors such as optical sensors that emit and detect light (e.g., optical proximity sensors such as transreflective optical proximity structures), ultrasonic sensors, and/or other touch and/or proximity sensors, monochromatic and color ambient light sensors, image sensors, fingerprint sensors, temperature sensors, proximity sensors and other sensors for measuring three-dimensional non-contact gestures ("air gestures"), pressure sensors, sensors for detecting position, orientation, and/or motion (e.g., accelerometers, magnetic sensors such as compass sensors, gyroscopes, and/or inertial measurement units that contain some or all of these sensors), health sensors, radio-frequency sensors, depth sensors (e.g., structured light sensors and/or depth sensors based on stereo imaging devices), optical sensors such as self-mixing sensors and light detection and ranging (lidar) sensors that gather time-of-flight measurements, humidity sensors, moisture sensors, gaze tracking sensors, and/or other sensors. In some arrangements, device 10 may use sensors 13 and/or other input-output devices to gather user input (e.g., buttons may be used to gather button press input, touch sensors overlapping displays can be used for gathering user touch screen input, touch pads may be used in gathering touch input, microphones may be used for gathering audio input, accelerometers may be used in monitoring when a finger contacts an input surface and may therefore be used to gather finger press input, etc.).

Display 14 may be an organic light-emitting diode display or may be a display based on other types of display technology (e.g., liquid crystal displays). Device configurations in which display 14 is an organic light-emitting diode display are sometimes described herein as an example. This is, however, merely illustrative. Any suitable type of display may be used, if desired. In general, display 14 may have a rectangular shape (i.e., display 14 may have a rectangular footprint and a rectangular peripheral edge that runs around the rectangular footprint) or may have other suitable shapes. Display 14 may be planar or may have a curved profile.

Figure 2:
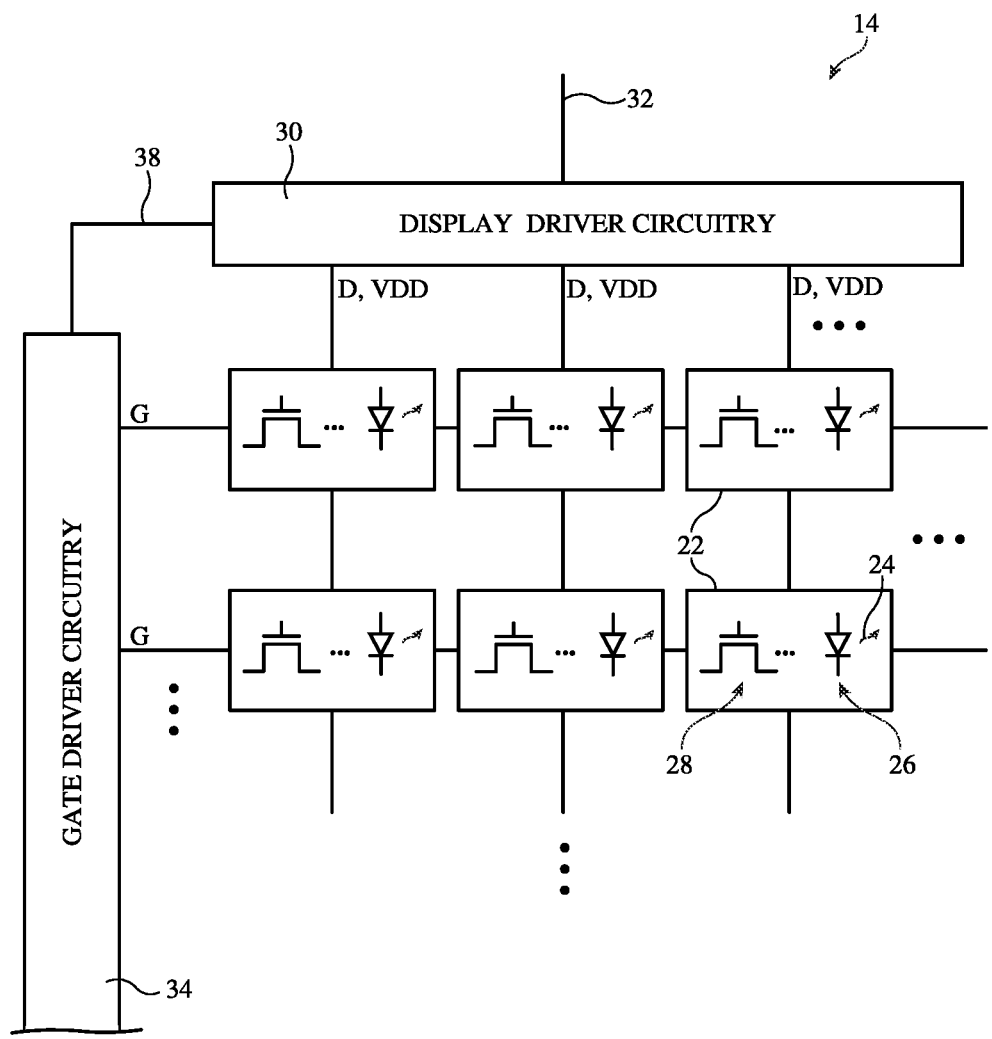
FIG. 2 is a schematic diagram of an illustrative display with light-emitting elements in accordance with an embodiment.

A top view of a portion of display 14 is shown in FIG. 2. As shown in FIG. 2, display 14 may have an array of pixels 22 formed on a substrate. Pixels 22 may receive data signals over signal paths such as data lines D and may receive one or more control signals over control signal paths such as horizontal control lines G (sometimes referred to as gate lines, scan lines, emission control lines, etc.). There may be any suitable number of rows and columns of pixels 22 in display 14 (e.g., tens or more, hundreds or more, or thousands or more). Each pixel 22 may include a light-emitting diode 26 that emits light 24 under the control of a pixel control circuit formed from thin-film transistor circuitry such as thin-film transistors 28 and thin-film capacitors.

Thin-film transistors 28 may be polysilicon thin-film transistors, semiconducting-oxide thin-film transistors such as indium zinc gallium oxide (IGZO) transistors, or thin-film transistors formed from other semiconductors. Pixels 22 may contain light-emitting diodes of different colors (e.g., red, green, and blue) to provide display 14 with the ability to display color images or may be monochromatic pixels.

Display driver circuitry may be used to control the operation of pixels 22. The display driver circuitry may be formed from integrated circuits, thin-film transistor circuits, or other suitable circuitry. Display driver circuitry 30 of FIG. 2 may contain communications circuitry for communicating with system control circuitry such as control circuitry 16 of FIG. 1 over path 32. Path 32 may be formed from traces on a flexible printed circuit or other cable. During operation, the control circuitry (e.g., control circuitry 16 of FIG. 1) may supply display driver circuitry 30 with information on images to be displayed on display 14.

To display the images on display pixels 22, display driver circuitry 30 may supply image data to data lines D while issuing clock signals and other control signals to supporting display driver circuitry such as gate driver circuitry 34 over path 38. If desired, display driver circuitry 30 may also supply clock signals and other control signals to gate driver circuitry 34 on an opposing edge of display 14.

Gate driver circuitry 34 (sometimes referred to as row control circuitry) may be implemented as part of an integrated circuit and/or may be implemented using thin-film transistor circuitry. Horizontal control lines G in display 14 may carry gate line signals such as scan line signals, emission enable control signals, and other horizontal control signals for controlling the display pixels 22 of each row. There may be any suitable number of horizontal control signals per row of pixels 22 (e.g., one or more row control signals, two or more row control signals, three or more row control signals, four or more row control signals, etc.).

The region on display 14 where the display pixels 22 are formed may sometimes be referred to herein as the active area. Electronic device 10 has an external housing with a peripheral edge. The region surrounding the active area and within the peripheral edge of device 10 is the border region. Images can only be displayed to a user of the device in the active region. It is generally desirable to minimize the border region of device 10. For example, device 10 may be provided with a full-face display 14 that extends across the entire front face of the device. If desired, display 14 may also wrap around over the edge of the front face so that at least part of the lateral edges or at least part of the back surface of device 10 is used for display purposes.

Figure 3:
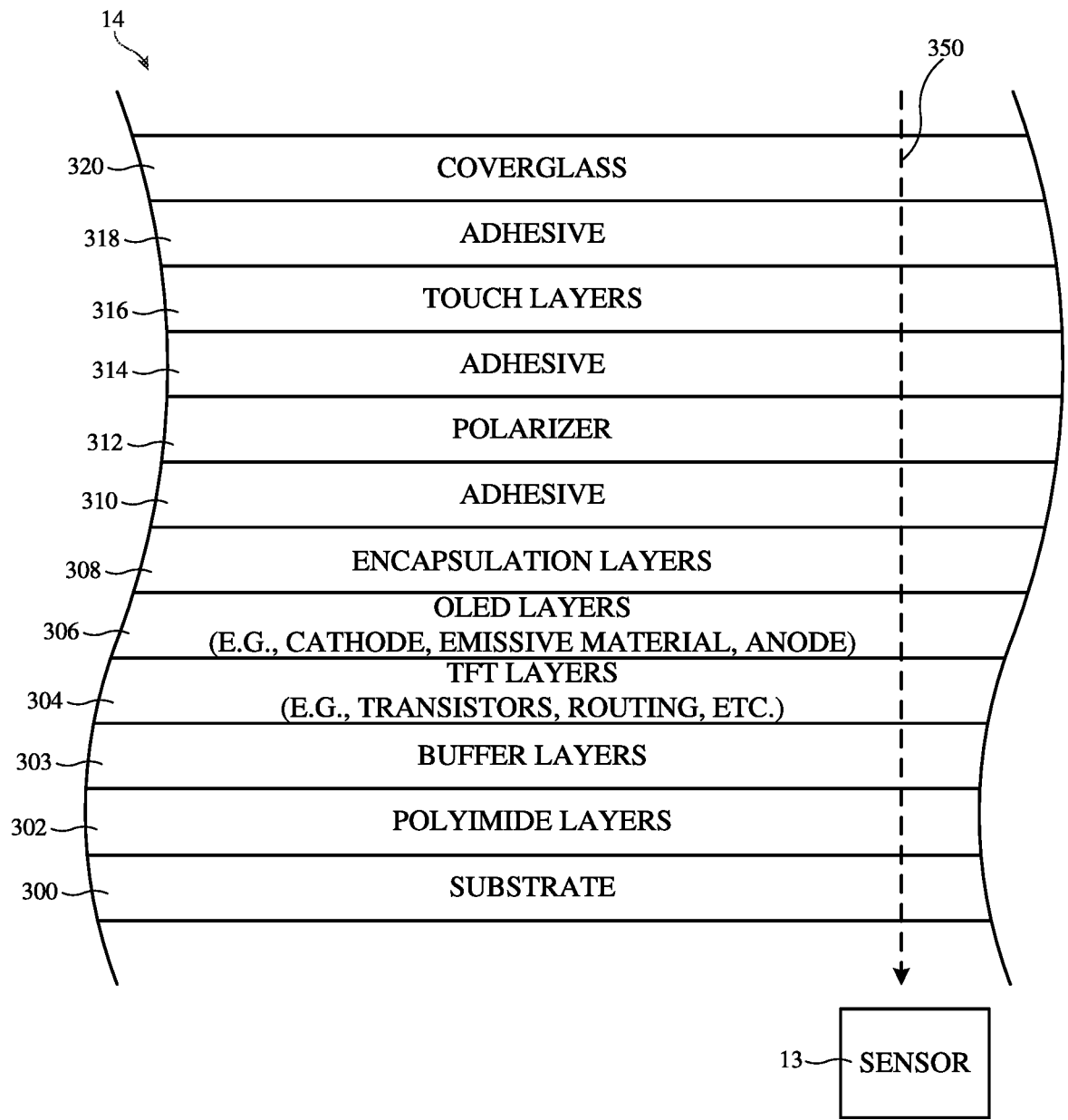
FIG. 3 is a cross-sectional side view of an illustrative display stack that at least partially covers a sensor in accordance with an embodiment.

Device 10 may include a sensor 13 mounted behind display 14 (e.g., behind the active area of the display). FIG. 3 is a cross-sectional side view of an illustrative display stack of display 14 that at least partially covers a sensor in accordance with an embodiment. As shown in FIG. 3, the display stack may include a substrate such as substrate 300. Substrate 300 may be formed from glass, metal, plastic, ceramic, sapphire, or other suitable substrate materials. In some arrangements, substrate 300 may be an organic substrate formed from polyethylene terephthalate (PET) or polyethylene naphthalate (PEN) (as examples). One or more polyimide (PI) layers 302 may be formed over substrate 300. The polyimide layers may sometimes be referred to as an organic substrate (e.g., substrate 300 is a first substrate layer and substrate 302 is a second substrate layer). The surface of substrate 302 may optionally be covered with one or more buffer layers 303 (e.g., inorganic buffer layers such as layers of silicon oxide, silicon nitride, amorphous silicon, etc.).

Thin-film transistor (TFT) layers 304 may be formed over inorganic buffer layers 303 and organic substrates 302 and 300. The TFT layers 304 may include thin-film transistor circuitry such as thin-film transistors, thin-film capacitors, associated routing circuitry, and other thin-film structures formed within multiple metal routing layers and dielectric layers. Organic light-emitting diode (OLED) layers 306 may be formed over the TFT layers 304. The OLED layers 306 may include a diode cathode layer, a diode anode layer, and emissive material interposed between the cathode and anode layers. The OLED layers may include a pixel definition layer that defines the light-emitting area of each pixel. The TFT circuitry in layer 304 may be used to control an array of display pixels formed by the OLED layers 306.

Circuitry formed in the TFT layers 304 and the OLED layers 306 may be protected by encapsulation layers 308. As an example, encapsulation layers 308 may include a first inorganic encapsulation layer, an organic encapsulation layer formed on the first inorganic encapsulation layer, and a second inorganic encapsulation layer formed on the organic encapsulation layer. Encapsulation layers 308 formed in this way can help prevent moisture and other potential contaminants from damaging the conductive circuitry that is covered by layers 308. Substrate 300, polyimide layers 302, buffer layers 303, TFT layers 304, OLED layers 306, and encapsulation layers 308 may be collectively referred to as a display panel.

One or more polarizer films 312 may be formed over the encapsulation layers 308 using adhesive 310. Adhesive 310 may be implemented using optically clear adhesive (OCA) material that offer high light transmittance. One or more touch layers 316 that implement the touch sensor functions of touch-screen display 14 may be formed over polarizer films 312 using adhesive 314 (e.g., OCA material). For example, touch layers 316 may include horizontal touch sensor electrodes and vertical touch sensor electrodes collectively forming an array of capacitive touch sensor electrodes. Lastly, the display stack may be topped off with a cover glass layer 320 (sometimes referred to as a display cover layer 320) that is formed over the touch layers 316 using additional adhesive 318 (e.g., OCA material). display cover layer 320 may be a transparent layer (e.g., transparent plastic or glass) that serves as an outer protective layer for display 14. The outer surface of display cover layer 320 may form an exterior surface of the display and the electronic device that includes the display.

Still referring to FIG. 3, sensor 13 may be formed under the display stack within the electronic device 10. As described above in connection with FIG. 1, sensor 13 may be an optical sensor such as a camera, proximity sensor, ambient light sensor, fingerprint sensor, or other light-based sensor. In such scenarios, the performance of sensor 13 depends on the transmission of light traversing through the display stack, as indicated by arrow 350. A typical display stack, however, has fairly limited transmission properties. For instance, more than 80% of light in the visible and infrared light spectrum might be lost when traveling through the display stack, which makes sensing under display 14 challenging.

Each of the multitude of layers in the display stack contributes to the degraded light transmission to sensor 13. In particular, the dense thin-film transistors and associated routing structures in TFT layers 304 of the display stack contribute substantially to the low transmission. In accordance with an embodiment, at least some of the display pixels may be selectively removed in regions of the display stack located directly over sensor(s) 13. Regions of display 14 that at least partially cover or overlap with sensor(s) 13 in which at least a portion of the display pixels have been removed are sometimes referred to as pixel removal regions. Removing display pixels (e.g., removing transistors and/or capacitors associated with one or more sub-pixels) in the pixel free regions can drastically help increase transmission and improve the performance of the under-display sensor 13. In addition to removing display pixels, portions of additional layers such as polyimide layers 302 and/or substrate 300 may be removed for additional transmission improvement. Polarizer 312 may also be bleached for additional transmission improvement.

Figure 4:
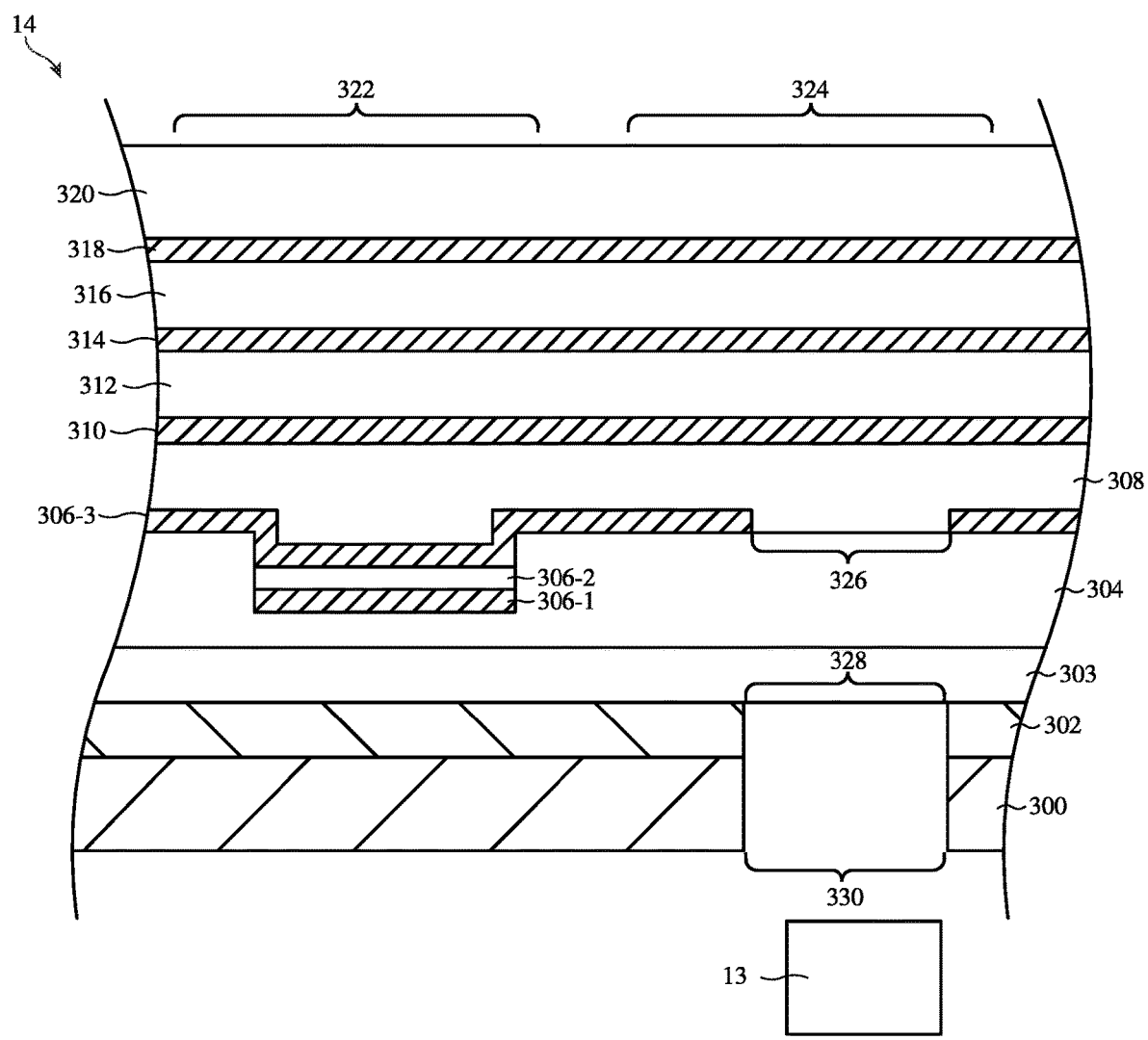
FIG. 4 is a cross-sectional side view of an illustrative display stack with a pixel removal region that includes an opening in a substrate layer in accordance with an embodiment.

FIG. 4 is a cross-sectional side view of an illustrative display showing how pixels may be removed in a pixel removal region to increase transmission through the display. As shown in FIG. 4, display 14 may include a pixel region 322 and a pixel removal region 324. In the pixel region 322, the display may include a pixel formed from emissive material 306-2 that is interposed between an anode 306-1 and a cathode 306-3. Signals may be selectively applied to anode 306-1 to cause emissive material 306-2 to emit light for the pixel. Circuitry in thin-film transistor layer 304 may be used to control the signals applied to anode 306-1.

In pixel removal region 324, anode 306-1 and emissive material 306-2 may be omitted. Without the pixel removal region, an additional pixel may be formed in area 324 adjacent to the pixel in area 322. However, to increase the transmittance of light to sensor 13 under the display, the pixels in area 324 are removed. The absence of emissive material 306-2 and anode 306-1 may increase the transmittance through the display stack. Additional circuitry within thin-film transistor layer 304 may also be omitted in pixel removal area to increase transmittance.

Additional transmission improvements through the display stack may be obtained by selectively removing additional components from the display stack in pixel removal area 324. As shown in FIG. 4, a portion of cathode 306-3 may be removed in pixel removal region 324. This results in an opening 326 in the cathode 306-3. Said another way, the cathode 306-3 may have conductive material that defines an opening 326 in the pixel removal region. Removing the cathode in this way allows for more light to pass through the display stack to sensor 13. Cathode 306-3 may be formed from any desired conductive material. The cathode may be removed via etching (e.g., laser etching or plasma etching). Alternatively, the cathode may be patterned to have an opening in pixel removal region 324 during the original cathode deposition and formation steps.

Polyimide layers 302 may be removed in pixel removal region 324 in addition to cathode layer 306-3. The removal of the polyimide layers 302 results in an opening 328 in the pixel removal region. Said another way, the polyimide layer may have polyimide material that defines an opening 328 in the pixel removal region. The polyimide layers may be removed via etching (e.g., laser etching or plasma etching). Alternatively, the polyimide layers may be patterned to have an opening in pixel removal region 324 during the original polyimide formation steps. Removing the polyimide layer 302 in pixel removal region 324 may result in additional transmittance of light to sensor 13 in pixel removal region 324.

Substrate 300 may be removed in pixel removal region 324 in addition to cathode layer 306-3 and polyimide layer 302. The removal of the substrate 300 results in an opening 330 in the pixel removal region. Said another way, the substrate 300 may have material (e.g., PET, PEN, etc.) that defines an opening 330 in the pixel removal region. The substrate may be removed via etching (e.g., with a laser). Alternatively, the substrate may be patterned to have an opening in pixel removal region 324 during the original substrate formation steps. Removing the substrate 300 in pixel removal region 324 may result in additional transmittance of light to sensor 13 in pixel removal region 324. The polyimide opening 328 and substrate opening 330 may be considered to form a single unitary opening. When removing portions of polyimide layer 302 and/or substrate 300, inorganic buffer layers 303 may serve as an etch stop for the etching step. Openings 328 and 330 may be filled with air or another desired transparent filler.

In addition to having openings in cathode 306-3, polyimide layers 302, and/or substrate 300, the polarizer 312 in the display may be bleached for additional transmittance in the pixel removal region.

Figure 5:
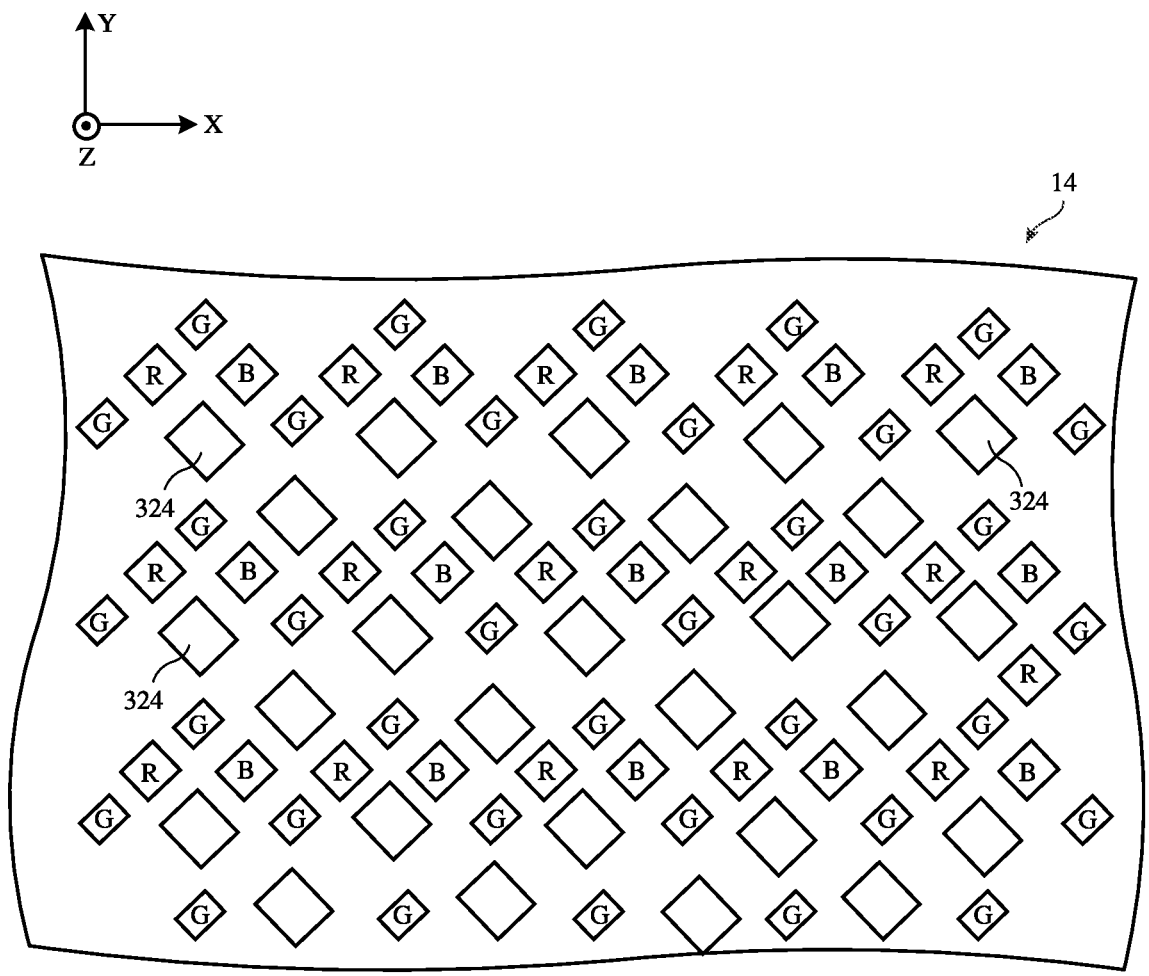
FIG. 5 is a top view of an illustrative display with transparent openings that overlap a sensor in accordance with an embodiment.

FIG. 5 is a top view of an illustrative display showing how pixel removal regions may be incorporated into the display. As shown, the display may include a plurality of pixels. In FIG. 5, there are a plurality of red pixels (R), a plurality of blue pixels (B), and a plurality of green pixels (G). The red, blue, and green pixels may be arranged in any desired pattern. In pixel removal areas 324, no pixels are included in the display (even though pixels would normally be present if the normal pixel pattern was followed).

As shown in FIG. 5, display 14 may include an array of pixel removal regions 324. Each pixel removal region 324 may have an increased transparency compared to pixel region 322. Therefore, the pixel removal regions 324 may sometimes be referred to as transparent windows 324, transparent display windows 324, transparent openings 324, transparent display openings 324, etc. The transparent display windows may allow for light to be transmitted to an underlying sensor, as shown in FIG. 4. The transparency of transparent openings 324 (for visible and/or infrared light) may be greater than 25%, greater than 30%, greater than 40%, greater than 50%, greater than 60%, greater than 70%, greater than 80%, greater than 90%, etc. The transparency of transparent openings 324 may be greater than the transparency of pixel region 322. The transparency of pixel region 322 may be less than 25%, less than 20%, less than 10%, less than 5%, etc. The pixel region 322 may sometimes be referred to as opaque display region 322, opaque region 322, opaque footprint 322, etc. Opaque region 322 includes light emitting pixels R, G, and B, and blocks light from passing through the display to an underlying sensor 13.

In general, the display subpixels may be partially removed from any region(s) of display 14. Display 14 may have one or more localized regions in which the pixels are selectively removed. The display may have various local pixel removal regions physically separated from one another (e.g., a first display area with a plurality of transparent windows 324 and a second, separate display area with a plurality of transparent windows 324). The various local areas might for example correspond to different sensors formed underneath display 14 (e.g., a first sensor under the first display area and a second sensor under the second display area). Display 14 may include transparent windows with one or more underlying sensors along the top border of display 14, at a corner of display 14 (e.g., a rounded corner of display 14), in the center portion along the top edge of the display (e.g., a notch area in the display), etc. The areas in display 14 with transparent windows 324 may have different shapes and sizes.

The pattern of pixels and pixel removal regions in FIG. 5 is merely illustrative. In FIG. 5, the display edge may be parallel to the X axis or the Y axis. The front face of the display may be parallel to the XY plane such that a user of the device views the front face of the display in the Z direction. In FIG. 5, every other subpixel may be removed for each color. The resulting pixel configuration has 50% of the subpixels removed. In FIG. 5, the remaining pixels follow a zig-zag pattern across the display (with two green sub-pixels for every one red or blue sub-pixel). In FIG. 5, the sub-pixels are angled relative to the edges of the display (e.g., the edges of the sub-pixels are at non-zero, non-orthogonal angles relative to the X-axis and Y-axis). This example is merely illustrative. If desired, each individual subpixel may have edges parallel to the display edge, a different proportion of pixels may be removed for different colors, the remaining pixels may follow a different pattern, etc.

Removing pixels from pixel removal regions 324 may be useful for allowing light to pass through the display to sensor 13 (as discussed in connection with FIG. 3). However, the absence of pixels in the pixel removal regions may be detectable to a viewer of the display. To mitigate the disruption caused by the pixel removal regions, the display may also include a diffractive layer.

Figure 6:
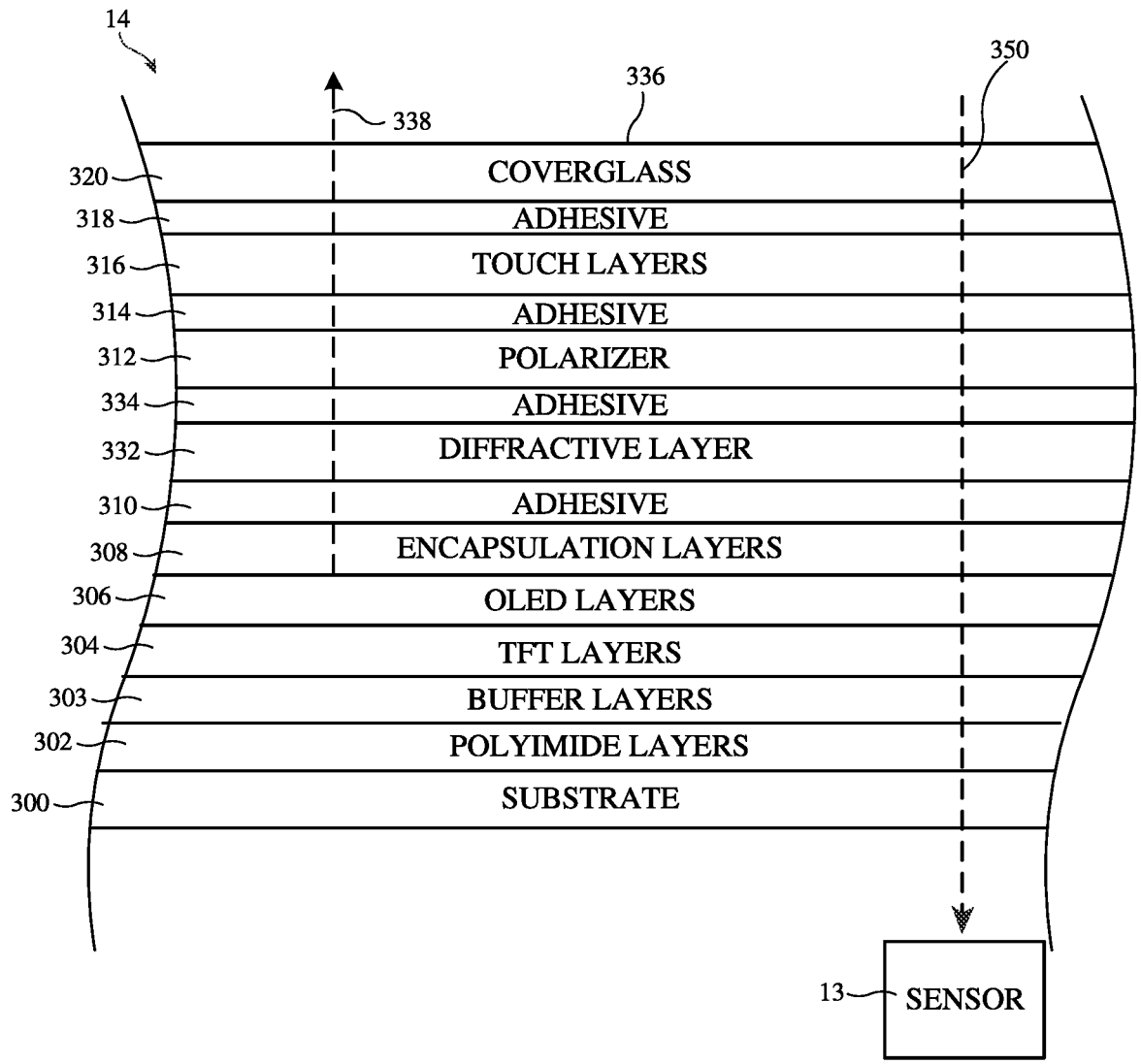
FIG. 6 is a cross-sectional side view of an illustrative display stack with a diffractive layer for increasing the apparent resolution of the display in accordance with an embodiment.

FIG. 6 is a side view of an illustrative display with a diffractive layer. Display 14 in FIG. 6 may have the same arrangement as the display in FIG. 3 and FIG. 4. The display includes a substrate 300, polyimide layers 302, buffer layers 303, TFT layers 304, OLED layers 306, encapsulation layers 308, adhesive 310, polarizer 312, adhesive 314, touch layers 316, adhesive 318, and cover glass 320. One or more of these layers may be patterned to allow light 350 to pass through the display to an underlying sensor 13. Pixels may be removed as shown in FIG. 5 to allow for light to pass through to the sensor.

Display 14 also includes diffractive layer 332 interposed between polarizer 312 and OLED layers 306. Diffractive layer 332 may spread the light from a pixel (e.g., formed by OLED layers 306) to cover one or more non-light-emitting areas adjacent to that pixel (e.g., pixel removal regions 324). Directing light from the pixels to the non-light-emitting areas increases a perceived resolution of the display for the viewer. Because the diffractive layer 332 effectively expands the light-emitting area of a given pixel, the diffractive layer may instead be referred to as light spreading layer 332, pixel expansion layer 332, pixel widening layer 332, etc.

The light spreading layer 332 may use diffraction of light to create duplicate light-emitting areas (e.g., duplicate pixels) that are shifted relative to the actual light-emitting areas (e.g., actual pixels or original pixels). The duplicate pixel areas may be shifted to occupy the otherwise non-light-emitting areas to increase the apparent resolution of the display and reduce screen door effect. The diffractive layer may have diffractive structures that create the duplicate pixels using diffraction. This example is merely illustrative, and other types of pixel expansion layers may be used if desired. For example, the pixel expansion layer may be a diffusion layer that evenly spreads the light from the light-spreading area, a refractive layer with prisms or other structures to direct the light in a desired manner, etc.

As shown in FIG. 6, adhesive layers such as adhesive layers 310 and 334 may be used to secure the pixel expansion layer within the display. In the example of FIG. 6, a first adhesive layer 310 is interposed between encapsulation layers 308 and pixel expansion layer 332. A second adhesive layer 334 is interposed between pixel expansion layer 332 and polarizer 312. Adhesive layers 310 and 334 may be optically clear adhesive (OCA), liquid optically clear adhesive (LOCA), or any other desired type of adhesive.

Positioning diffractive layer 332 beneath polarizer 312 may mitigate reflections off of the diffractive layer from being observed by the viewer. Covering the diffractive layer 332 with polarizer 312 mitigates potential rainbow artifacts caused by the diffractive layer.

Herein, the term pixel may be used to refer to both a light-emitting component on a display substrate (e.g., a pixel formed from OLED layers 306 and TFT layers 304) or a light-emitting area on the outer surface 336 of display cover layer 320 (e.g., on the outer surface of protective layer 320). Light 338 may be generated by pixels formed by OLED layers 306 and TFT layers 304. Diffractive layer 332 may then redirect some of the light to different positions at output surface 336. The pixels at the output surface of the cover glass (sometimes referred to as the output surface of the display) therefore may have a different arrangement (e.g., different sizes, spacing, positions, etc.) than the pixels formed by OLED layers 306 due to the pixel expansion performed by pixel expansion layer 332.

Figure 7A:
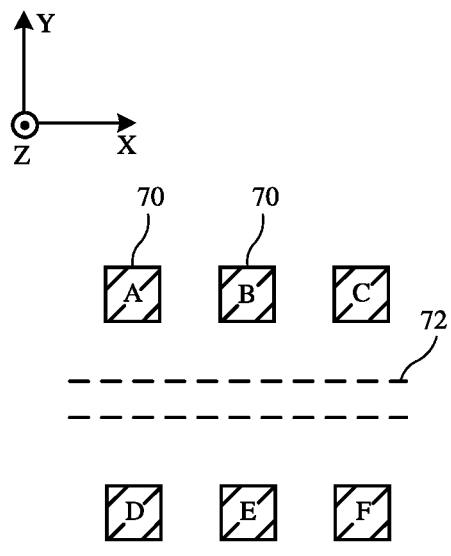
FIG. 7A is a top view of illustrative display pixels in accordance with an embodiment.
Figure 7B:
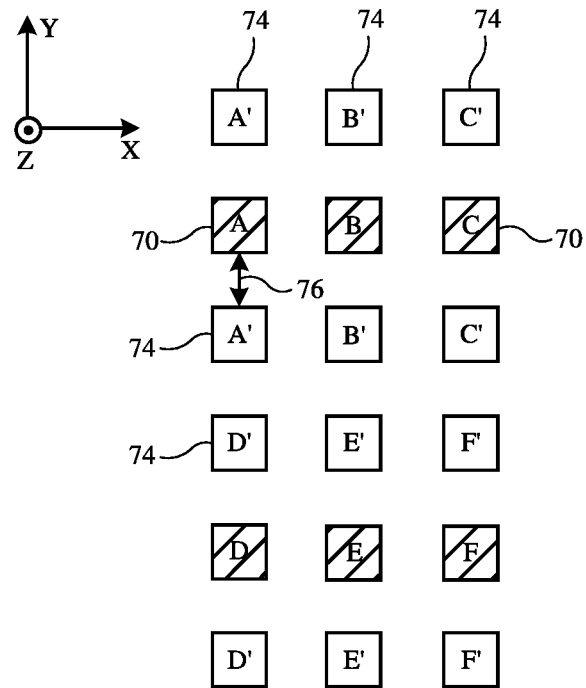
FIG. 7B is a top view of illustrative display pixels and non-overlapping duplicate pixels in accordance with an embodiment.

FIGS. 7A-7D are top views of illustrative pixels on an output surface of a display cover layer showing how a diffractive layer such as diffractive layer 332 may increase the apparent resolution of the display. FIG. 7A shows pixels on the output surface of the display cover layer (e.g., the outer surface of protective layer 320) without diffractive layer 332 present. FIG. 7B shows pixels on the output surface of the display cover layer when diffractive layer 332 is present. FIG. 7A shows six pixels 70 (A, B, C, D, E, and F) arranged in a grid of two row and three columns. Without diffractive layer 332, a dark band 72 may be formed between the pixels (due to the absence of pixels in the pixel removal regions). Dark band 72 may be present due to relatively large spacing between pixels 70. The area of dark band 72 is not illuminated by any of the pixels and therefore appears black when viewed by a user.

Diffractive layer 332 may create duplicate pixels that occupy the space between the original pixels to eliminate the presence of the dark band between the pixels. FIG. 7B again has six pixels 70 (A, B, C, D, E, and F) arranged in a grid on the output surface of the display cover layer. However, diffractive layer 332 creates duplicate pixels 74 that are present on the outer surface of the display cover layer in addition to pixels 70. Diffractive layer 332 may create any desired number of duplicate pixels. In the example of FIG. 7B, diffractive layer 332 creates 2 duplicate pixels that are positioned on opposing sides of each original pixel.

Pixel A has 2 associated duplicate pixels A', pixel B has 2 associated duplicate pixels B', pixel C has 2 associated duplicate pixels C', pixel D has 2 associated duplicate pixels D', pixel E has 2 associated duplicate pixels E', and pixel F has 2 associated duplicate pixels F'. Because pixels 70 are originally present on the display (e.g., on a display panel for the display that includes OLED layers 306 and TFT layers 304), pixels 70 may sometimes be referred to as original pixels (in contrast to the duplicate pixels 74 which are not present on the display panel).

The duplicate pixels 74 generated by diffractive layer 332 occupy the space between original pixels 70. Thus, the gap in light-emitting area between the original pixels (band 72 from FIG. 7A) is not present. The diffractive layer therefore increases the apparent resolution of the display by generating duplicate pixels to occupy the space between the original pixels on the output surface of the display cover layer.

In FIG. 7B, each duplicate pixel may be separated from its associated original pixel by a distance 76. Distance 76 may be greater than 5 micron, greater than 10 micron, greater than 25 micron, greater than 50 micron, greater than 70 micron, greater than 100 micron, greater than 500 micron, less than 200 micron, less than 100 micron, less than 50 micron, between 20 and 100 micron, etc. Distance 76 may be tuned depending on the spacing between original pixels 70. Distance 76 may be more than 10% of the distance between adjacent original pixels 70, more than 30% of the distance between adjacent original pixels 70, less than 50% of the distance between adjacent original pixels 70, between 10% and 50% of the distance between adjacent original pixels 70, between 20% and 40% of the distance between adjacent original pixels 70, between 30% and 70% of the distance between adjacent original pixels 70, etc. In FIG. 7B, distance 76 is selected such that the duplicate pixels occupy the non-light-emitting areas between original pixels without overlapping adjacent original pixels or adjacent duplicate pixels. However, this example merely illustrative.

Figure 7C:
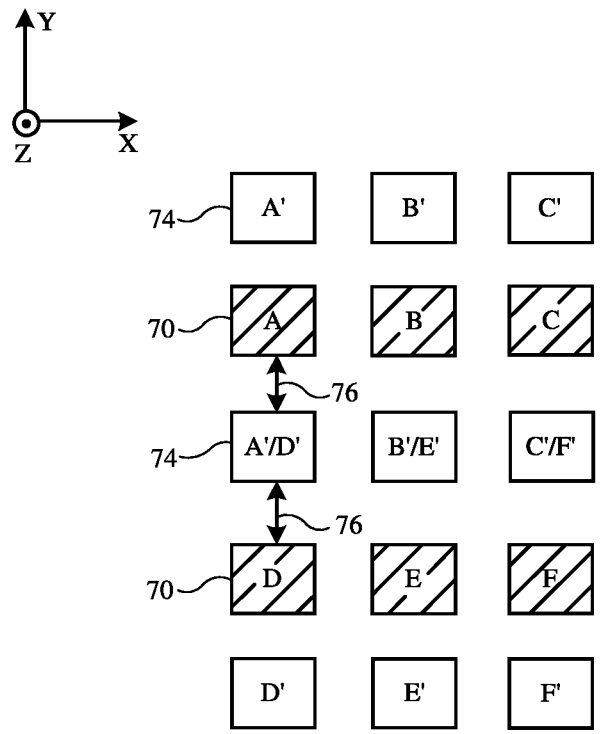
FIG. 7C is a top view of illustrative display pixels and overlapping duplicate pixels in accordance with an embodiment.

In another embodiment, shown in FIG. 7C, distance 76 is selected such that the duplicate pixels occupy the non-light-emitting areas between original pixels and overlap adjacent duplicate pixels. As shown in FIG. 7C, each pixel again has two associated duplicate pixels. However, the duplicate pixels between each adjacent row of original pixels overlap to form one unitary duplicate pixel. For example, pixel A has 2 associated duplicate pixels A' and pixel D has 2 associated duplicate pixels D'. However, the center-to-center spacing 76 between original pixel A and duplicate pixel A' is approximately half of the center-to-center spacing between original pixels A and D. Similarly, the center-to-center spacing 76 between original pixel D and duplicate pixel D' is approximately half of the center-to-center spacing between original pixels A and D. Therefore, duplicate pixels A' and D' overlap and may form an apparent unitary duplicate pixel A'/D' (as shown in FIG. 7C). The brightness of duplicate pixel 74 will therefore be an average of the brightness of original pixels A and D.

Having duplicate pixels overlap as shown in FIG. 7C may be useful for equalizing the brightness of the duplicate pixels and the original pixels. The original pixel at the display panel level may have a maximum brightness. Spreading the light to cover duplicate pixels results in a lower intensity in the pixels at the outer surface of the cover glass. Specifically, the original pixel (e.g., pixel A) at the output surface of the display cover layer may have a brightness of 50% (relative to the brightness at the display panel level) and each duplicate pixel may have a brightness of 25%. The light from the pixel in the display panel is therefore spread to different areas at the outer surface of the cover glass. With an arrangement of the type shown in FIG. 7C, the duplicate pixels overlap and therefore have a combined brightness of 50%. This means that, across the output surface, both the original pixels and the unitary duplicate pixels may have a brightness of 50% relative to at the panel level.

The example in FIGS. 7B and 7C of each original pixel having 2 associated duplicate pixels is merely illustrative. Each original pixel may have more than 2 associated duplicate pixels, more than 4 associated duplicate pixels, more than 6 associated duplicate pixels, more than 8 associated duplicate pixels, more than 10 associated duplicate pixels, less than 10 associated duplicate pixels, between 4 and 10 associated duplicate pixels, 1 associated duplicate pixel, etc. The depiction of discrete duplicate pixels in FIGS. 7B and 7C is also merely illustrative. In some cases, a duplicate light-emitting area may be created by diffractive layer 332 that has a different shape than original pixel 70. For example, a duplicate pixel may be formed by a continuous ring of light that surrounds an original pixel and duplicates the light from the original pixel.

Figure 7D:
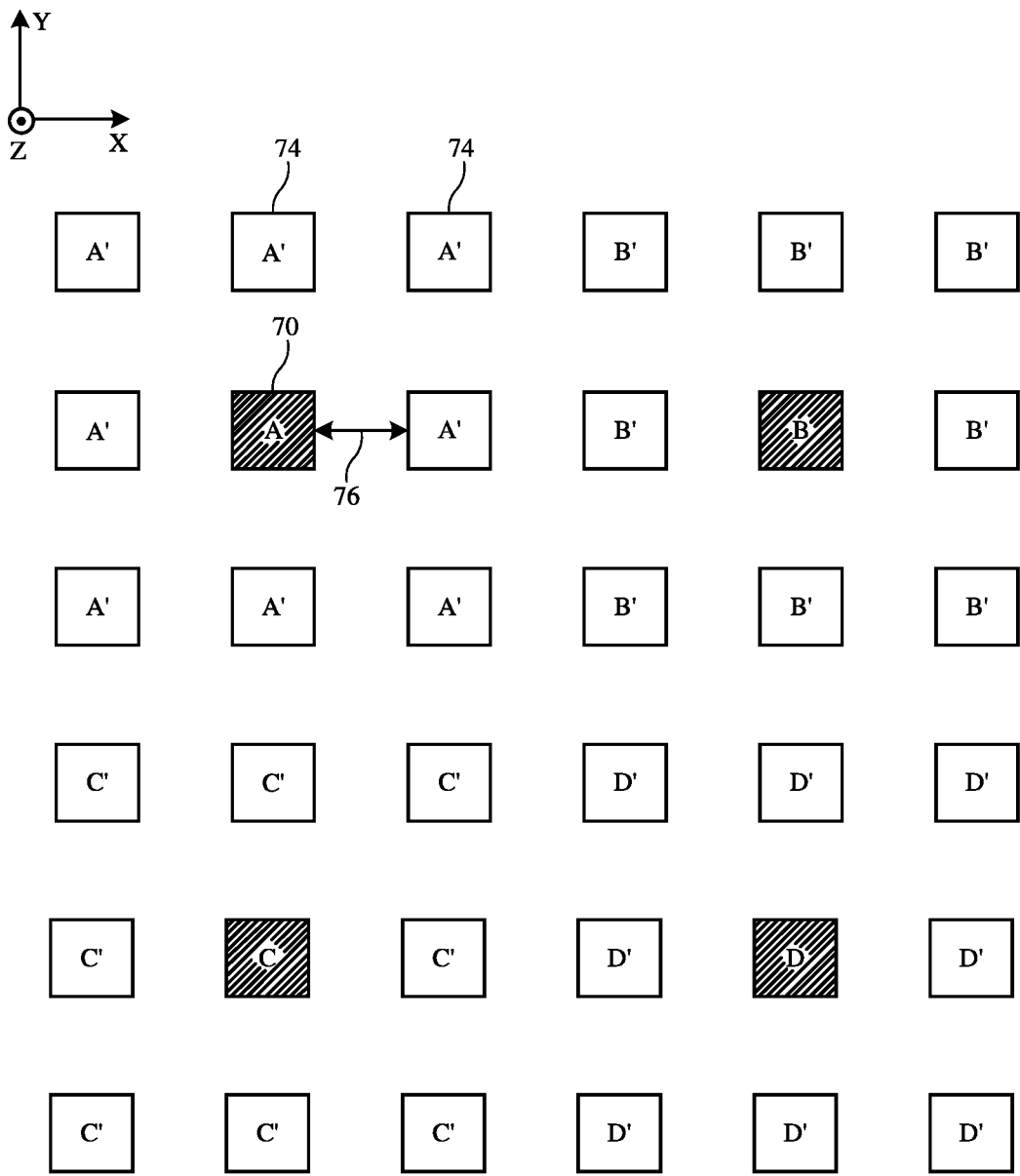
FIG. 7D is a top view of illustrative display pixels and duplicate pixels that are spread in multiple directions in accordance with an embodiment.

In FIG. 7B, the light from the original pixel is spread along one-dimension (e.g., the Y-axis). This example is merely illustrative. Each original pixel may have light spread along two or more axes. FIG. 7D shows an example where light from the original pixels is spread along multiple axes. FIG. 7D shows four original pixels 70 (A, B, C, and D) arranged in a 2×2 grid. Diffractive layer 332 creates 8 duplicate pixels that are arranged in a grid-like pattern around each original pixel. Pixel A has 8 associated duplicate pixels A', pixel B has 8 associated duplicate pixels B', pixel C has 8 associated duplicate pixels C', and pixel D has 8 associated duplicate pixels D'. Light is therefore spread along both the X-axis and Y-axis in the embodiment of FIG. 7D.

Diffractive layer 332 may be formed in a variety of different ways. In one example, shown in FIG. 8A, diffractive layer 332 has a first layer 82 with a varying thickness. A second layer 84 may conform to the first layer. Layer 84 has a planar upper surface in FIG. 8A and therefore also has a varying thickness. Layers 82 and 84 may have different refractive indices. The difference in refractive indices may cause diffraction at the interface between layers 82 and 84 when light passes through the diffractive layer.

Layer 82 has first portions with a first thickness 86 and second portions with a second thickness 88. Thickness 88 is smaller than thickness 86, creating gaps above the second portions and between the first portions. Layer 84 fills these gaps, creating a difference in refractive index in a plane (parallel to the XY-plane) that includes both portions of layer 84 and portions of layer 82.

Layers 82 and 84 may be formed from any desired material (e.g., glass, silicon, polymer, etc.). The layers may be formed from a transparent polymer material in one example (e.g., photopolymer). In some cases, layer 82 and/or 84 may be formed from a layer that has another function in the electronic device. For example, layer 82 and/or layer 84 may be an adhesive layer. Layer 84 may be formed by adhesive layer 334 in FIG. 6, as one example. Layer 82 may be formed by adhesive layer 310 in FIG. 6, in another example. One of layers 82 and 84 may be formed from air (e.g., an air gap) if desired.

Thicknesses 86 and 88 may each be less than 3 micron, less than 5 micron, less than 10 micron, less than 20 micron, less than 50 micron, less than 1 micron, greater than 0.1 micron, greater than 1 micron, greater than 50 micron, between 1 and 10 micron, etc. The difference between the two thicknesses may be less than 3 micron, less than 5 micron, less than 10 micron, less than 20 micron, less than 50 micron, less than 1 micron, greater than 0.1 micron, greater than 1 micron, greater than 50 micron, between 1 and 10 micron, etc. Each one of layers 82 and 84 may have a refractive index that is greater than 1.0, greater than 1.2, greater than 1.3, greater than 1.4, greater than 1.5, greater than 1.6, less than 1.7, less than 1.5, less than 1.3, between 1.1 and 1.5, etc. The difference between the refractive indices of layers 82 and 84 may be greater than 0.1, greater than 0.2, greater than 0.3, greater than 0.5, less than 0.5, less than 0.3, between 0.1 and 0.5, between 0.1, and 0.3, etc.

It should be noted that, in some displays, the light 338 emitted by the display panel is a different type of light than the light 350 sensed by sensor 13. For example, the OLED layers 306 in FIG. 6 may emit visible light (e.g., light at wavelengths between 380 nanometers and 700 nanometers). In contrast, sensor 13 may be used to sense a different type of light such as infrared light (e.g., light at wavelengths between 700 nanometers and 1 millimeter). Of course, the exact wavelengths of each different type of light may vary.

In general, sensor 13 may sense light at a peak wavelength that is different (e.g., greater) than a peak wavelength of light emitted by OLED layer 306.

In an embodiment where sensor 13 senses a different type of light than OLED layer 306 emits, the diffractive layer 332 may be optimized to spread light only from the OLED layers 306. In other words, the diffractive layer 332 may be designed to spread light 338 without spreading light 350. The materials of the diffractive layer may have an index of refraction difference at visible wavelengths (e.g., a difference greater than 0.1, greater than 0.2, greater than 0.3, greater than 0.5, less than 0.5, less than 0.3, between 0.1 and 0.5, between 0.1, and 0.3, etc.) while having little to no index of refraction difference (e.g., a difference less than 0.1, less than 0.05, less than 0.01, etc.) at infrared wavelengths. As a result, the diffractive layer spreads the visible light from the OLED display panel without significantly affecting the infrared light passing through the display to sensor 13. The materials in the diffractive layer 332 may use dispersion to achieve the wavelength-dependent refractive index difference.

Each portion of layer 82 with thickness 86 may sometimes be referred to as a diffractive element or diffractive structure. The repeating diffractive elements may be separated by pitch 90. Pitch 90 may be less than 5 micron, less than 10 micron, less than 15 micron, less than 20 micron, less than 50 micron, less than 100 micron, greater than 1 micron, greater than 5 micron, greater than 10 micron, greater than 15 micron, greater than 20 micron, between 1 and 20 micron, between 5 and 10 micron, between 1 and 10 micron, between 1 and 5 micron, etc. Adhesive layers may be formed on either side of the diffractive layer of FIG. 8A.

Figure 8A:
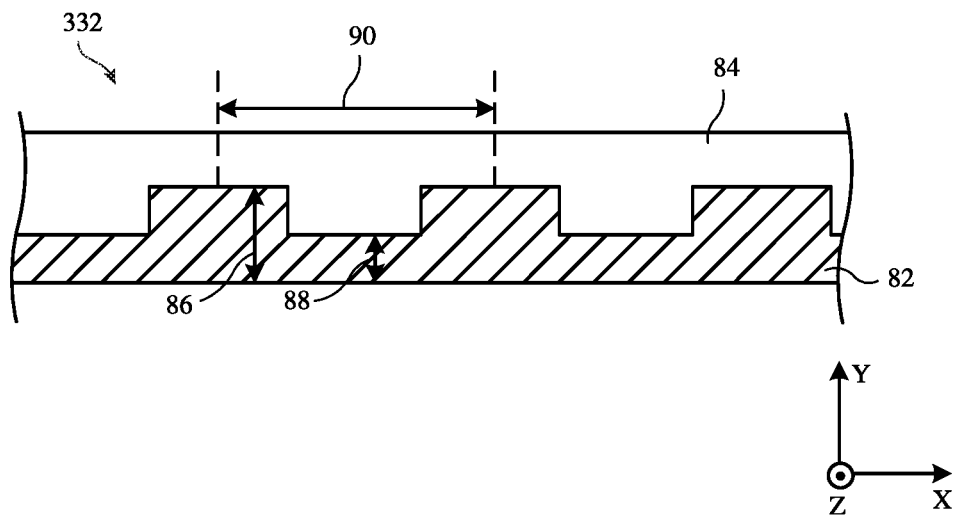
FIG. 8A is a cross-sectional side view of an illustrative diffractive layer that includes layers having different refractive indices and varying thicknesses in accordance with an embodiment.
Figure 8B:
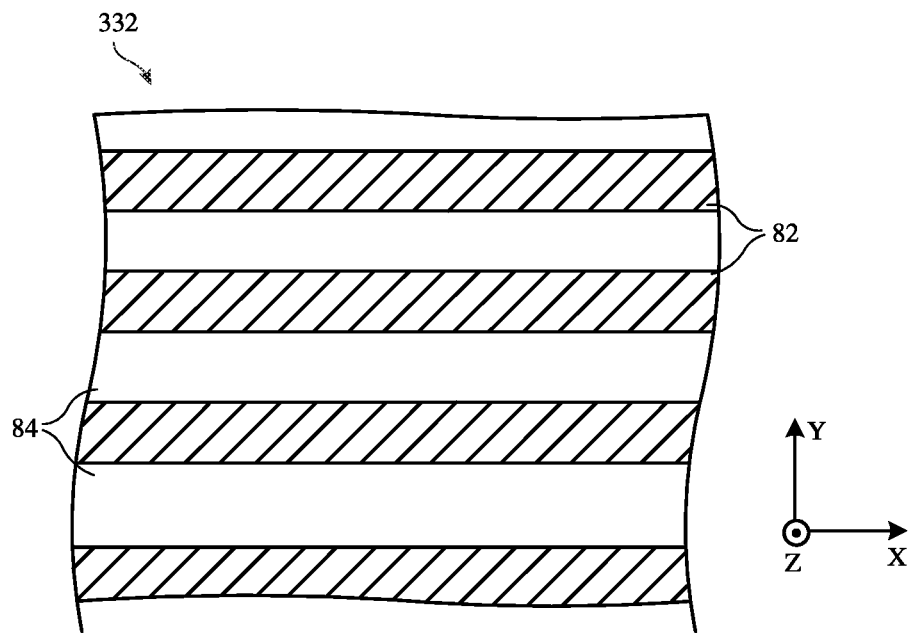
FIG. 8B is a top view showing illustrative patterns for the diffractive layer of FIG. 8A in accordance with an embodiment.

As shown in FIG. 8B, the thicker portions of layer 82 extend in strips across the diffractive layer. The strips of layer 82 are separated by strips of layer 84 (e.g., a strip of layer 84 is interposed between each pair of adjacent strips of layer 82). With this type of arrangement, light may be spread in the positive and negative Y-direction (e.g., to create two duplicate pixels on either side of an original pixel as shown in FIG. 7C).

It should be understood that diffractive layer 332 as shown in FIG. 8A is formed over regions of the display with transparent openings 324 (e.g., as in FIG. 5). In areas of the display without any transparent openings 324, the display may have a full resolution of original pixels. Creating duplicate pixels to occupy non-light emitting areas associated with the transparent openings is therefore not necessary. Accordingly, in areas of the display that do not include transparent windows, one or more layers of the diffractive layer may optionally be omitted, may have a uniform thickness to prevent formation of diffractive elements, etc. In general, the diffractive layer may be designed to include diffractive elements for spreading light over areas of the display with transparent openings and to not include diffractive elements for spreading light over areas of the display without transparent openings.

Figure 9A:
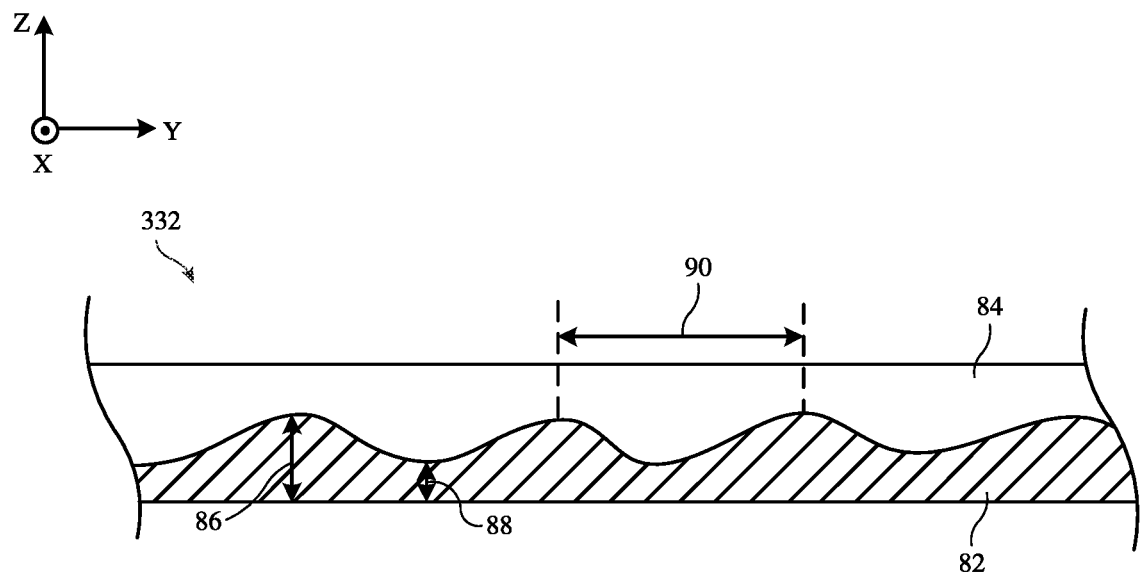
FIG. 9A is a cross-sectional side view of an illustrative diffractive layer that includes layers having different refractive indices and gradually varying thicknesses in accordance with an embodiment.

The example of FIGS. 8A and 8B are merely illustrative. In another possible arrangement, diffractive layer 332 may be formed from a single layer that has a varying index of refraction within the XY-plane. The diffractive layer may also have a gradual thickness change instead of a thickness step change as in FIG. 8A. FIG. 9A is a cross-sectional side view of an illustrative diffractive layer with a gradual thickness change. As shown in FIG. 9A, the thickness of layer 82 may vary in a curved pattern (sometimes referred to as a serpentine pattern, sinusoidal pattern, or wavy pattern) in the Y-direction.

Figure 9B:
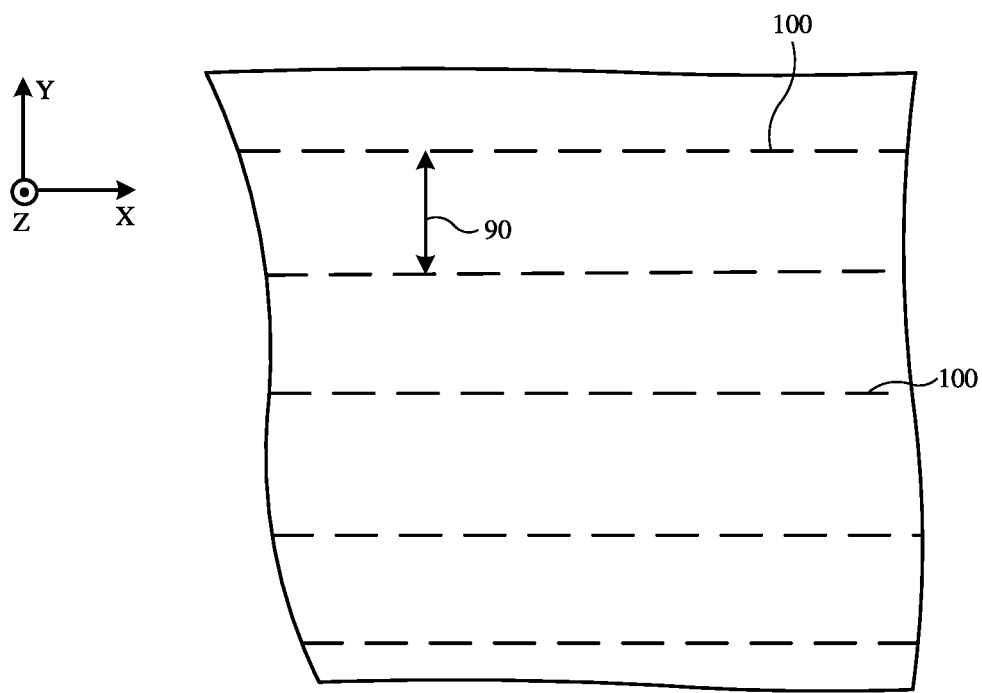
FIG. 9B is a top view showing illustrative patterns for the diffractive layer of FIG. 9A in accordance with an embodiment.

The materials, refractive indices, thicknesses, and pitch magnitudes in FIG. 9A may be the same as in FIG. 8A, but with a gradual thickness change between the thicknesses 86 and 88 in FIG. 9A instead of a step change as in FIG. 8A. Each protruding portion of layer 82 with maximum thickness 86 may sometimes be referred to as a diffractive element 100 or diffractive structure. The repeating diffractive elements may be separated by pitch 90. As shown in FIG. 9B, the diffractive elements 100 extend in strips across the diffractive layer. With this type of arrangement, light may be spread in the positive and negative Y-direction (e.g., to create two duplicate pixels on either side of an original pixel as shown in FIG. 7C).

The example of the diffractive layer having a thickness that varies in only one direction (as in FIG. 8A and FIG. 9A) is merely illustrative. Alternatively, the diffractive layer 332 may have a layer with a varying thickness in two directions (e.g., in both the X-direction and Y-direction) in order to spread light in two directions (as in FIG. 7D, for example). The diffractive layer 332 may also have diffractive elements that extend parallel to the Y-axis instead of the X-axis (and therefore spread light in the X-direction). In yet another embodiment, the diffractive elements 100 may extend at an angle relative to the edge of the display (e.g., a non-zero, non-orthogonal angle relative to the X-axis in FIG. 9B). The diffractive elements 100 may extend at a 45° angle or some other desired angle relative to the edge of the display.

The pitch 90 of the diffractive elements may be optimized for a particular wavelength of light. For example, the pitch 90 may be optimized to spread green light. Green light may have a wavelength of approximately (e.g., +/−5%) 550 nanometers. The diffractive elements may be optimized for green light because the human eye is most sensitive to green light.

Figure 10:
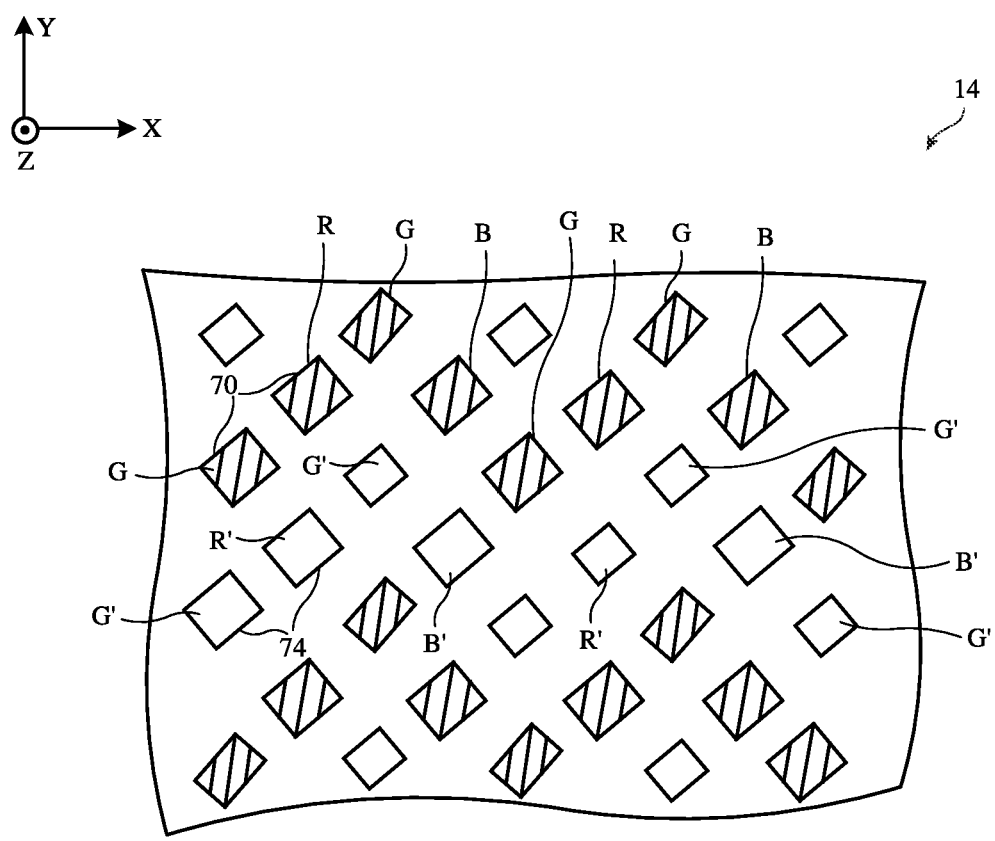
FIG. 10 is a top view of an illustrative display having display pixels and duplicate pixels in accordance with an embodiment.

FIG. 10 is a top view of the illustrative display of FIG. 5 covered by the diffractive layer of FIGS. 9A and 9B. As shown, duplicate pixels 74 may be formed between the original pixels 70. For example, a duplicate green pixel G' is formed from two duplicate versions of the original green pixel on either side of G (similar to as in FIG. 7C). In this way, the pixel pattern has the same arrangement on the outer surface of the display as it would without the pixel removal regions.

The pixel pattern on the outer surface of the display is therefore uniform between areas with the pixel removal regions and areas without the pixel removal regions. For example, a portion of the display cover layer overlapping an area of the display panel without pixel removal regions may have a first resolution (associated with the full resolution of the display panel). A different portion of the display cover layer overlapping an area of the display with pixel removal regions may also have the first resolution (even though the overlapped portion of the display panel has a second resolution that is lower than the first resolution) due to the presence of the diffractive layer. Portions of the cover layer overlapping and not overlapping pixel removal regions may ultimately have the same pixel pattern (e.g., as shown in FIG. 10). However, in portions of the cover layer not overlapping pixel removal regions the pattern is of all original pixels from the display panel. In portions of the cover layer overlapping pixel removal regions the pattern is of some original pixels and some duplicate pixels.

Incorporating pixel removal regions having an increased transparency relative to the rest of the display is one way to increase the amount of light received by a sensor underneath the display. Another possibility to increase the amount of light received by the sensor is include a lens layer with one or more lenses that focus light onto the pixel removal regions.

Figure 11:
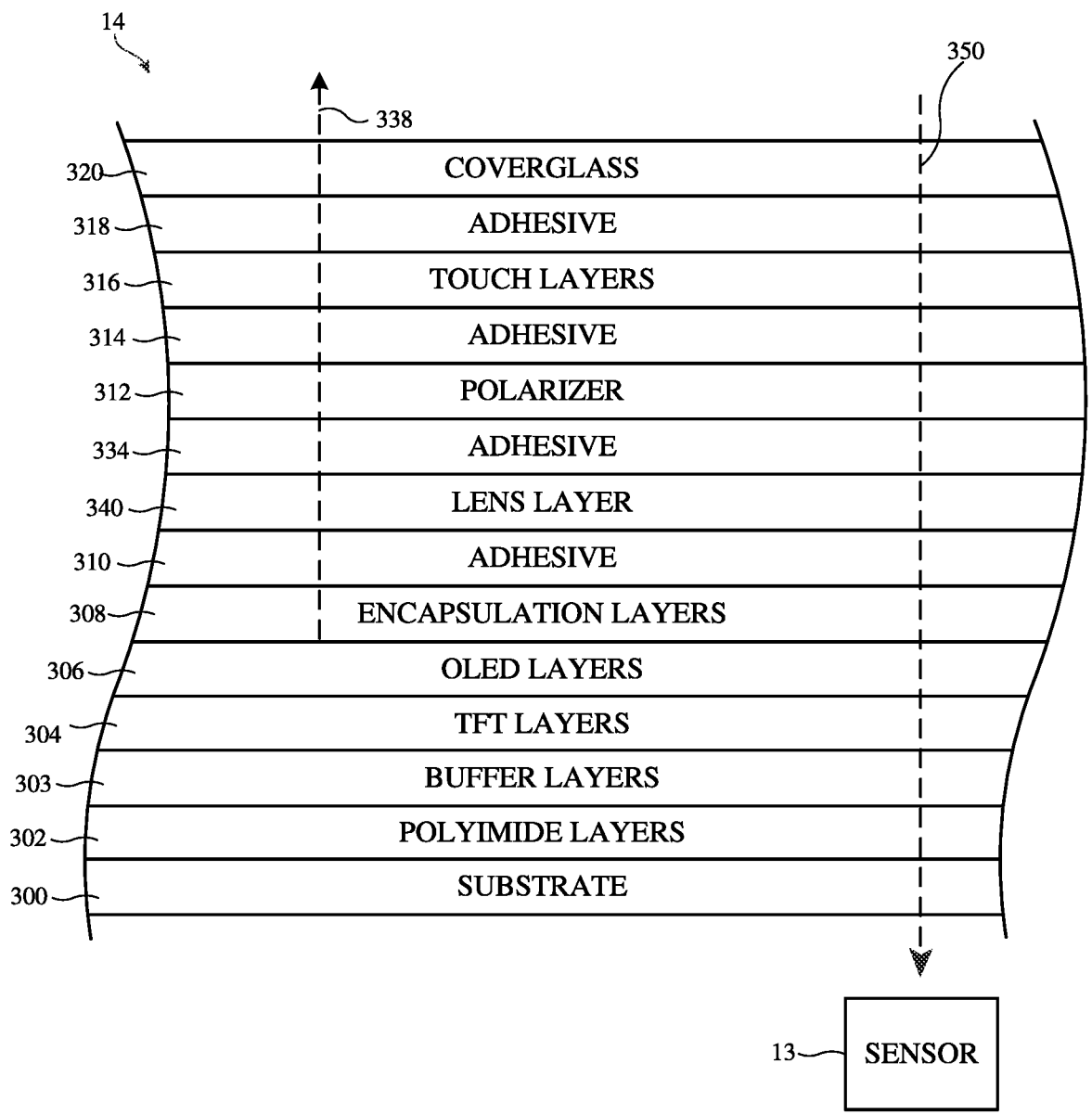
FIG. 11 is a cross-sectional side view of an illustrative display stack with a lens layer for focusing light into transparent openings in the display in accordance with an embodiment.

FIG. 11 is a side view of an illustrative display with a lens layer. Display 14 in FIG. 11 may have the same arrangement as the display in FIG. 3 and FIG. 4. The display includes a substrate 300, polyimide layers 302, buffer layers 303, TFT layers 304, OLED layers 306, encapsulation layers 308, adhesive 310, polarizer 312, adhesive 314, touch layers 316, adhesive 318, and cover glass 320. One or more of these layers may be patterned to allow light 350 to pass through the display to an underlying sensor 13. Pixels may be removed as shown in FIG. 5 to allow for light to pass through to the sensor.

Display 14 also includes lens layer 340 interposed between polarizer 312 and OLED layers 306. Lens layer 340 (sometimes referred to as lens array 340, light focusing layer 340, etc.) may include one or more lenses (sometimes referred to as microlenses or lens elements) that focus ambient light onto the transparent windows in the display (e.g., pixel removal regions 324). Focusing light onto the transparent windows increases the amount of light received by sensor 13. The light focusing layer 340 may use refraction of light to focus light onto transparent windows in the display panel.

Positioning lens layer 340 beneath polarizer 312 may mitigate reflections off of the lens layer from being observed by the viewer. Covering the lens layer 340 with polarizer 312 mitigates potential rainbow artifacts caused by the lens layer.

Figure 12:
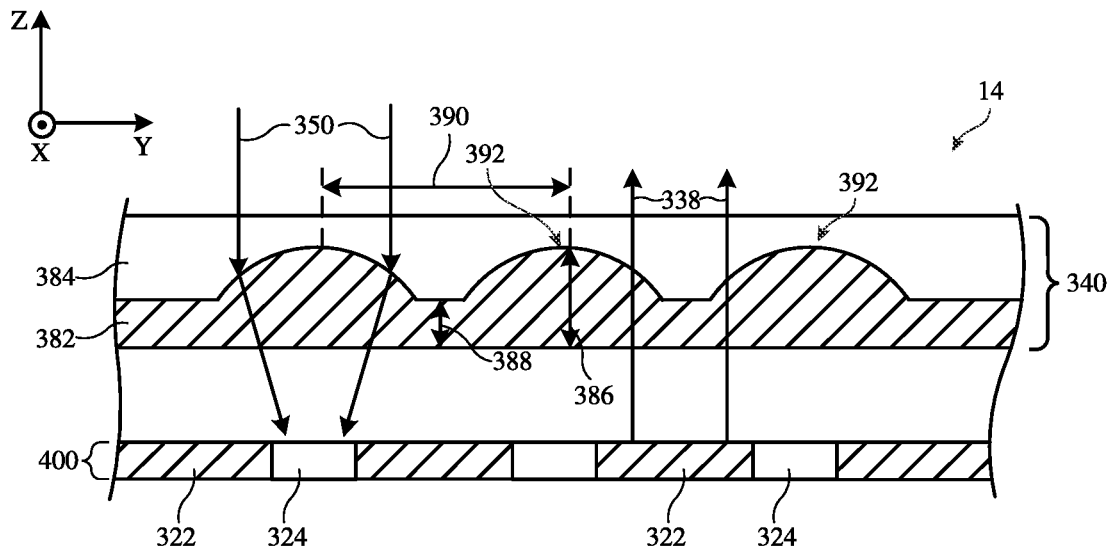
FIG. 12 is a cross-sectional side view of an illustrative display with a lens layer that includes layers having different refractive indices in accordance with an embodiment.

FIG. 12 is a side view showing an illustrative lens layer. As shown, lens layer 340 is formed over display panel 400 (which includes one or more of substrate 300, polyimide layers 302, buffer layers 303, TFT layers 304, OLED layers 306, and encapsulation layers 308). Similar to as discussed in connection with FIG. 4, display panel 400 has pixel regions 322 and one or more pixel removal regions 324 (transparent windows) having a higher transparency than pixel regions 322. Lens array 340 may focus light onto the transparent windows 324.

As shown, lens array 340 may include a first layer 382 with a varying thickness. A second layer 384 may conform to the first layer. Layer 384 has a planar upper surface in FIG. 12 and therefore also has a varying thickness. Layers 382 and 384 may have different refractive indices. The difference in refractive indices may cause refraction at the interface between layers 382 and 384 when light passes through the lens layer.

Layer 382 has a plurality of lenses 392 formed by protruding portions of layer 382. Layer 382 may have a maximum thickness 386 at the peak of each lens 392 and may have a minimum thickness 388 between each lens 392. Layer 384 fills the area between each lens 392, creating a difference in refractive index in a plane (parallel to the XY-plane) that includes both portions of layer 384 and portions of layer 382.

Layers 382 and 384 may be formed from any desired material (e.g., glass, silicon, polymer, etc.). The layers may be formed from a transparent polymer material in one example (e.g., photopolymer). In some cases, layer 382 and/or 384 may be formed from a layer that has another function in the electronic device. For example, layer 382 and/or layer 384 may be an adhesive layer. Layer 384 may be formed by adhesive layer 334 in FIG. 11, as one example. Layer 382 may be formed by adhesive layer 310 in FIG. 11, in another example. One of layers 382 and 384 may be formed from air (e.g., an air gap) if desired.

Thicknesses 386 and 388 may each be less than 3 micron, less than 5 micron, less than 10 micron, less than 20 micron, less than 50 micron, less than 100 micron, less than 75 micron, less than 1 micron, greater than 0.1 micron, greater than 1 micron, greater than 25 micron, greater than 50 micron, greater than 75 micron, between 1 and 10 micron, etc. The difference between the two thicknesses may be less than 3 micron, less than 5 micron, less than 10 micron, less than 20 micron, less than 50 micron, less than 1 micron, greater than 0.1 micron, greater than 1 micron, greater than 50 micron, between 1 and 10 micron, etc. Each one of layers 382 and 384 may have a refractive index that is greater than 1.0, greater than 1.2, greater than 1.3, greater than 1.4, greater than 1.5, greater than 1.6, less than 1.7, less than 1.5, less than 1.3, between 1.1 and 1.5, etc. The difference between the refractive indices of layers 382 and 384 may be greater than 0.1, greater than 0.2, greater than 0.3, greater than 0.5, less than 0.5, less than 0.3, between 0.1 and 0.5, between 0.1, and 0.3, etc.

In displays where the light 338 emitted by the display panel is a different type of light than the light 350 sensed by sensor 13, the lens layer 340 may be optimized to focus light 350 without affecting light emitted from the display panel. The materials of the lens layer may have an index of refraction difference at infrared wavelengths (e.g., a difference greater than 0.1, greater than 0.2, greater than 0.3, greater than 0.5, less than 0.5, less than 0.3, between 0.1 and 0.5, between 0.1, and 0.3, etc.) while having little to no index of refraction difference (e.g., a difference less than 0.1, less than 0.05, less than 0.01, etc.) at visible wavelengths. As a result, the lens layer focuses the infrared light through transparent windows 324 to sensor 13 without significantly affecting the visible light 338 emitted by display panel 400. The materials in the lens layer 340 may use dispersion used to achieve the wavelength-dependent refractive index difference.

Lenses 392 may be separated by pitch 390. Pitch 390 may be less than 5 micron, less than 10 micron, less than 15 micron, less than 20 micron, less than 50 micron, less than 100 micron, greater than 1 micron, greater than 5 micron, greater than 10 micron, greater than 15 micron, greater than 20 micron, greater than 50 micron, greater than 75 micron, greater than 100 micron, between 20 and 100 micron, between 30 and 70 micron, between 1 and 20 micron, between 5 and 10 micron, between 1 and 10 micron, between 1 and 5 micron, etc. Adhesive layers may be formed on either side of the lens layer of FIG. 12.

It should be understood that lens layer 340 as shown in FIG. 12 is formed over regions of the display with transparent openings 324. In areas of the display without any transparent openings 324, a lens layer for focusing light into transparent openings is not necessary. Accordingly, in areas of the display that do not include transparent windows, one or more layers of the lens layer may optionally be omitted, may have a uniform thickness to prevent formation of lenses, etc. In general, the lens layer may be designed to include lenses for focusing light over areas of the display with transparent openings and to not include lenses for focusing light over areas of the display without transparent openings.

Figure 13:
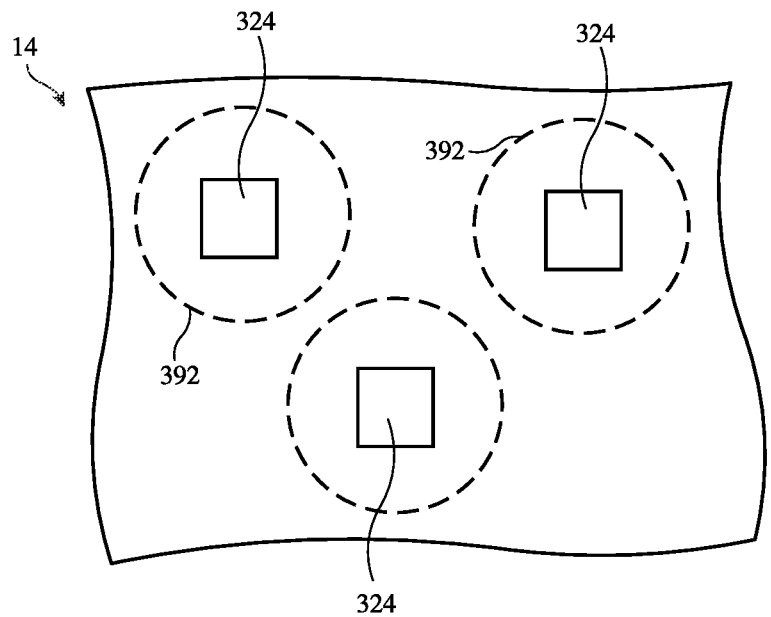
FIG. 13 is a top view of the illustrative display of FIG. 12 in accordance with an embodiment.

FIG. 13 is a top view of a display with a lens layer of the type shown in FIG. 12. As shown, each transparent window 324 may be covered by a respective lens 392 of lens layer 340. The lenses may have circular outlines when viewed from above (as shown in FIG. 13). This example is merely illustrative. The lenses may have outlines of other shapes when viewed from above if desired. The lenses may have a spherical upper surface of upper surface of another desired shape/curvature. The lenses may use refraction to focus light onto the underlying transparent windows 324.

Figure 14:
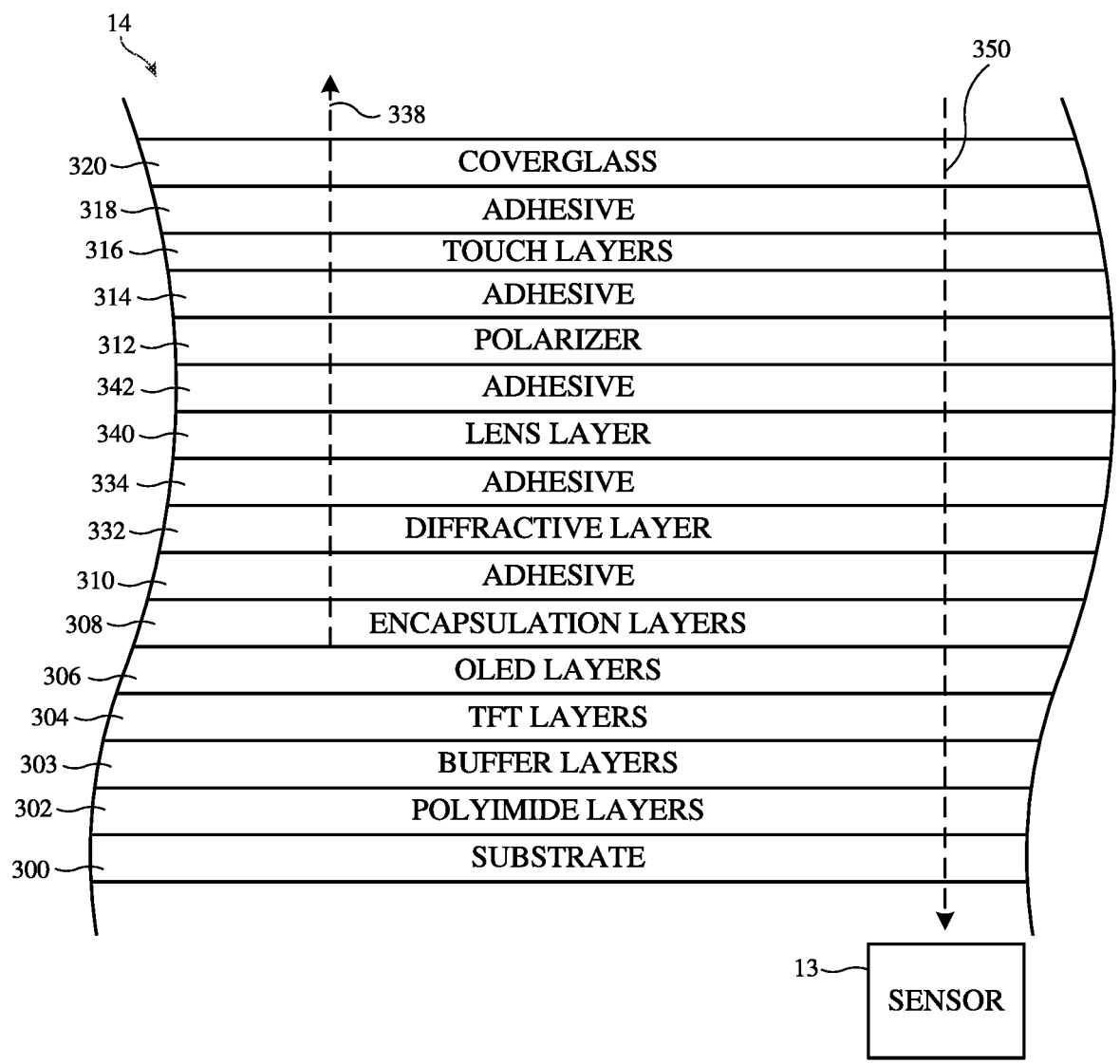

FIG. 14 is a side view of an illustrative display that includes both a diffractive layer 332 and a lens layer 340. Adhesive layers 310, 334, and 342 may be used to secure layers 332 and 340 within the display stack. The display may include both layers 332 and 340 to optimize the emission of display light 338 and the sensing of light 350. Layer 332 may selectively spread display light 338 without affecting light 350 that passes through to sensor 13. Layer 340 may focus light 350 onto sensor 13 without affecting display light 338. Layer 332 may be formed from materials that are approximately index-matched at a first wavelength (e.g., an infrared wavelength) and that have an index of refraction difference at a second wavelength (e.g., a visible wavelength). Layer 340 may be formed from materials that are approximately index-matched at a first wavelength (e.g., a visible wavelength) and that have an index of refraction difference at a second wavelength (e.g., an infrared wavelength).

As described above, one aspect of the present technology is the gathering and use of information such as information from input-output devices. The present disclosure contemplates that in some instances, data may be gathered that includes personal information data that uniquely identifies or can be used to contact or locate a specific person. Such personal information data can include demographic data, location-based data, telephone numbers, email addresses, twitter ID's, home addresses, data or records relating to a user's health or level of fitness (e.g., vital signs measurements, medication information, exercise information), date of birth, username, password, biometric information, or any other identifying or personal information.

The present disclosure recognizes that the use of such personal information, in the present technology, can be used to the benefit of users. For example, the personal information data can be used to deliver targeted content that is of greater interest to the user. Accordingly, use of such personal information data enables users to calculated control of the delivered content. Further, other uses for personal information data that benefit the user are also contemplated by the present disclosure. For instance, health and fitness data may be used to provide insights into a user's general wellness, or may be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users, and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the United States, collection of or access to certain health data may be governed by federal and/or state laws, such as the Health Insurance Portability and Accountability Act (HIPAA), whereas health data in other countries may be subject to other regulations and policies and should be handled accordingly. Hence different privacy practices should be maintained for different personal data types in each country.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, the present technology can be configured to allow users to select to "opt in" or "opt out" of participation in the collection of personal information data during registration for services or anytime thereafter. In another example, users can select not to provide certain types of user data. In yet another example, users can select to limit the length of time user-specific data is maintained. In addition to providing "opt in" and "opt out" options, the present disclosure contemplates providing notifications relating to the access or use of personal information. For instance, a user may be notified upon downloading an application ("app") that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data at a city level rather than at an address level), controlling how data is stored (e.g., aggregating data across users), and/or other methods.

Therefore, although the present disclosure broadly covers use of information that may include personal information data to implement one or more various disclosed embodiments, the present disclosure also contemplates that the various embodiments can also be implemented without the need for accessing personal information data. That is, the various embodiments of the present technology are not rendered inoperable due to the lack of all or a portion of such personal information data.

The foregoing is merely illustrative and various modifications can be made by those skilled in the art without departing from the scope and spirit of the described embodiments. The foregoing embodiments may be implemented individually or in any combination.

What is claimed is:
1. An electronic device, comprising:
a sensor; and
a display that overlaps the sensor, wherein the sensor is configured to sense light that passes through the display and wherein the display comprises:

a display panel that includes an array of pixels in a portion having a first transparency and a plurality of additional portions having a second transparency that is greater than the first transparency, wherein the plurality of additional portions allow light to pass through to the sensor, wherein a pixel in the array of pixels emits light at a first wavelength, and wherein the sensor is configured to sense light at a second wavelength that is different than the first wavelength;
a display cover layer that covers the display panel; and
a diffractive layer between the display panel and the display cover layer, wherein the diffractive layer comprises first and second layers that have a first refractive index difference at the first wavelength and a second refractive index difference at the second wavelength and wherein the first refractive index difference is greater than the second refractive index difference.

2. The electronic device defined in claim 1, wherein the display further comprises:
a polarizer that is interposed between the diffractive layer and the display cover layer.

3. The electronic device defined in claim 1, wherein each pixel of the array of pixels has a corresponding light-emitting area on the display cover layer and wherein the diffractive layer is configured to generate duplicate light-emitting areas on the display cover layer based on the light-emitting areas.

4. The electronic device defined in claim 1, wherein the diffractive layer is configured to generate duplicate pixels on the display cover layer.

5. The electronic device defined in claim 4, wherein the array of pixels has a first resolution in a first region of the display panel, wherein the display has a second resolution that is higher than the first resolution on a first region of an outer surface of the display cover layer, and wherein the first region of the outer surface of the display cover layer overlaps the first region of the display panel.

6. The electronic device defined in claim 1, wherein the second layer conforms to the first layer and wherein the first layer has a varying thickness.

7. The electronic device defined in claim 6, wherein the varying thickness of the first layer comprises a first thickness in first portions of the first layer and a second thickness that is different than the first thickness in second portions of the first layer.

8. The electronic device defined in claim 6, wherein the varying thickness of the first layer has a sinusoidal profile.

9. The electronic device defined in claim 1, wherein the diffractive layer is configured to spread light from the pixel to create first and second duplicate pixels on first and second opposing sides of the pixel and wherein the diffractive layer is configured to spread light from an additional pixel in the array of pixels to create third and fourth duplicate pixels on first and second opposing sides of the additional pixel and wherein the third duplicate pixel overlaps the second duplicate pixel.

10. The electronic device defined in claim 1, wherein the display further comprises:
a lens layer between the display panel and the display cover layer, wherein the lens layer comprises third and fourth layers that have a third refractive index difference at the first wavelength and a fourth refractive index difference that is greater than the third refractive index difference at the second wavelength.

11. An electronic device, comprising:
a display panel that includes a first portion having a first transparency, a plurality of pixels in the first portion that are configured to emit visible light, and a plurality of pixel-free second portions that have a higher transparency than the first transparency;
a lens layer, wherein the lens layer has a first refractive index difference at a visible wavelength and a second refractive index difference that is greater than the first refractive index difference at an infrared wavelength; and
a sensor that is overlapped by the plurality of pixel-free second portions and that is configured to sense infrared light, wherein the lens layer is configured to focus light through the pixel-free second portions towards the sensor.

12. The electronic device defined in claim 11, wherein the lens layer comprises first and second layers.

13. The electronic device defined in claim 11, further comprising:
a display cover layer, wherein the display cover layer overlaps the display panel; and
a light spreading layer that is formed separately from the lens layer and that is interposed between the display cover layer and the display panel.

14. The electronic device defined in claim 11, wherein the lens layer is configured to focus the light towards the sensor without affecting additional light emitted from the display panel.

15. The electronic device defined in claim 11, wherein the lens layer comprises a plurality of refractive lenses, wherein each refractive lens has a circular outline when viewed from above, and wherein each refractive lens has a spherical upper surface.

16. An electronic device comprising:
a display panel having an array of pixels, wherein the array of pixels has a first resolution in a first portion of the array of pixels and a second resolution that is less than the first resolution in a second portion of the array of pixels;
a display cover layer, wherein a first portion of the display cover layer overlaps the first portion of the display panel and a second portion of the display cover layer overlaps the second portion of the display panel; and
a light spreading layer that is interposed between the display cover layer and the display panel, wherein the light spreading layer is configured to spread light from a pixel in the array of pixels to create first and second duplicate pixels on first and second opposing sides of the pixel, wherein the light spreading layer is configured to spread light from an additional pixel in the array of pixels to create third and fourth duplicate pixels on first and second opposing sides of the additional pixel, and wherein the third duplicate pixel overlaps the second duplicate pixel.

17. The electronic device defined in claim 16, wherein the display panel includes a plurality of transparent windows in the second portion of the array of pixels and wherein the light spreading layer comprises a plurality of diffractive elements.

18. The electronic device defined in claim 16, further comprising:
a sensor, wherein the pixel in the array of pixels emits light at a first wavelength, wherein the sensor is configured to sense light at a second wavelength that is different than the first wavelength, wherein the light spreading layer comprises first and second layers that have a first refractive index difference at the first wavelength and a second refractive index difference at the second wavelength, and wherein the first refractive index difference is greater than the second refractive index difference.

19. The electronic device defined in claim 16, wherein the light spreading layer spreads light from the second portion of the array of pixels to have the first resolution at the second portion of the display cover layer.

* * * * *